(12) United States Patent
Domae et al.

(10) Patent No.: US 7,642,654 B2
(45) Date of Patent: *Jan. 5, 2010

(54) MULTILAYER WIRING STRUCTURE OF SEMICONDUCTOR DEVICE, METHOD OF PRODUCING SAID MULTILAYER WIRING STRUCTURE AND SEMICONDUCTOR TO BE USED FOR RELIABILITY EVALUATION

(75) Inventors: Shinichi Domae, Osaka (JP); Hiroshi Masuda, Osaka (JP); Yoshiaki Kato, Hyogo (JP); Kousaku Yano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/236,914

(22) Filed: Sep. 24, 2008

(65) Prior Publication Data

US 2009/0111262 A1 Apr. 30, 2009

Related U.S. Application Data

(60) Division of application No. 11/582,982, filed on Oct. 19, 2006, now Pat. No. 7,443,031, which is a continuation of application No. 10/837,596, filed on May 4, 2004, now Pat. No. 7,148,572, which is a division of application No. 10/443,826, filed on May 23, 2003, now Pat. No. 6,815,338, which is a division of application No. 09/760,640, filed on Jan. 17, 2001, now Pat. No. 6,580,176, which is a division of application No. 09/113,370, filed on Jul. 1, 1998, now Pat. No. 6,197,685.

(30) Foreign Application Priority Data

Jul. 11, 1997 (JP) .................................. 9-186140
Dec. 18, 1997 (JP) .................................. 9-348965

(51) Int. Cl.
*H01L 23/48* (2006.01)
*H01L 23/52* (2006.01)
*H01L 29/40* (2006.01)

(52) U.S. Cl. .................. 257/758; 257/760; 257/764; 257/774

(58) Field of Classification Search ................. 257/758, 257/760, 764, 774, E21.584
See application file for complete search history.

(56) References Cited

U.S. PATENT DOCUMENTS 5,354,712 A 10/1994 Ho et al.

(Continued)

FOREIGN PATENT DOCUMENTS

| JP | 4-296041 | 10/1992 |
|---|---|---|
| JP | 5-275426 | 10/1993 |
| JP | 7-130854 | 5/1995 |
| JP | 8-167609 | 6/1996 |
| JP | 8-191104 | 7/1996 |
| JP | 8-274101 | 10/1996 |

OTHER PUBLICATIONS

"Impact of Test Structure Design on Electromigration Lifetime Measurements", by Ting et al., Proc. of IEEE (1995), pp. 326-332.
"Stress-Induced Voiding in Stacked Tungsten Via Structure", by Domae et al., Proc. of IEEE, 98CH36173 36th Annual International Reliability Physics Symposium, Reno, Nevada (1998), pp. 318-323.

*Primary Examiner*—William M. Brewster
(74) *Attorney, Agent, or Firm*—McDermott Will & Emery LLP

(57) ABSTRACT

A multilayer wiring structure of a semiconductor device having a stacked structure is arranged to restrain reliability degradation due to stress applied to the region of wiring between opposite upper and lower plugs. The rate of overlap of contact surface between upper plug and wiring on contact surface between lower plug and wiring, is small to the extent that no void is generated. The multilayer wiring structure is produced such that no grain boundary is contained in the region of wiring between upper and lower plugs. The difference in thermal expansion coefficient between the material of wiring and the material of upper and lower plugs, is small to the extent that no void is generated.

34 Claims, 19 Drawing Sheets

U.S. PATENT DOCUMENTS

| | | |
|---|---|---|
| 5,428,251 A | 6/1995 | Naito et al. |
| 5,451,804 A | 9/1995 | Lur et al. |
| 5,627,345 A | 5/1997 | Yamamoto et al. |
| 5,691,572 A | 11/1997 | Chung |
| 5,777,486 A | 7/1998 | Hsu |
| 5,864,179 A | 1/1999 | Koyama |
| 5,904,556 A | 5/1999 | Suzuki et al. |
| 5,904,557 A | 5/1999 | Komiya et al. |
| 5,925,227 A | 7/1999 | Kobayashi et al. |
| 6,066,558 A | 5/2000 | Kawano et al. |
| 6,091,080 A | 7/2000 | Usui |
| 6,267,122 B1 | 7/2001 | Guldi et al. |
| 2005/0056834 A1 | 3/2005 | Park et al. |

MULTILAYER WIRING STRUCTURE OF SEMICONDUCTOR DEVICE, METHOD OF PRODUCING SAID MULTILAYER WIRING STRUCTURE AND SEMICONDUCTOR TO BE USED FOR RELIABILITY EVALUATION

RELATED APPLICATIONS

This application is a divisional of U.S. application Ser. No. 11/582,982, filed Oct. 19, 2006 now U.S. Pat. No. 7,443,031, which is a continuation of Ser. No. 10/837,596, filed May 4, 2004, now U.S. Pat. No. 7,148,572, which is a divisional of U.S. application Ser. No. 10/443,826, filed May 23, 2003, now U.S. Pat. No. 6,815,338, which is a divisional of U.S. application Ser. No. 09/760,640, filed Jan. 17, 2001, now U.S. Pat. No. 6,580,176, which is divisional of U.S. application Ser. No. 09/113,370, filed Jul. 1, 1998, now U.S. Pat. No. 6,197,685, which claims priority of Japanese Patent Application Nos. 9-186140, filed Jul. 11, 1997 and 9-348965, filed Dec. 18, 1997, the contents of which are herewith incorporated by reference.

BACKGROUND OF THE INVENTION

Recent miniaturization of the wirings in ULSIs disadvantageously contributes to a reduction in reliability of the wirings. In particular, due to a development in multilamination of wirings, there is increasingly used a so-called stacked structure in which upper and lower plugs made of a high-melting-point metal such as W (tungsten), TiN or the like and its compound, are respectively disposed, as opposite to each other, on and under a wiring. In such a stacked structure, that portion of the wiring held by and between the plugs is disadvantageously weak in reliability.

To enhance the wiring reliability, a first method of prior art is for example arranged to prevent the stress migration that stress from a protective layer disconnects wirings. More specifically, a wiring layer large in grain size is formed in a region in which a major portion of the electric current flows, and a wiring layer small in grain size is formed at a position to which stress is relatively readily applied, such as a surrounding of the wiring (in particular, lateral wall or upper end portion) (See Japanese Patent Laid-Open Publication No. 5-275426).

According to a second method of prior art, there is proposed a stacked structure in which the width of each wiring is smaller than the width of the lower-layer-side connection hole and in which the bottom of the upper-layer-side connection hole extends into the lower-layer-side connection hole such that the wiring is reinforced as if entirely surrounded (See Japanese Patent Laid-Open Publication No. 8-167609).

According to the first method of prior art, however, the wiring is formed by forming a wiring layer small in grain size at a lateral wall of a wiring layer large in grain size. This excessively increases the width of the wiring and is therefore not suitable for miniaturization.

According to the second method of prior art, the width of each of the upper- and lower-layer-side connection holes is inevitably larger than the width of the wiring. This is neither suitable for miniaturization. Further, no consideration has been taken for stress from a high-melting point metal or its compound which surrounds the wiring.

SUMMARY OF THE INVENTION

In a multilayer wiring structure of a semiconductor device having a stacked structure, the present invention is proposed with the object of restraining a wiring from being lowered in reliability, particularly, due to stress applied to that portion of the wiring held by and between upper- and lower-layer-side plugs.

Further, the present invention provides a semiconductor device which is to be used for reliability evaluation and which has a test pattern capable of detecting, with high sensitivity, a connection failure in a stacked structure.

More specifically, a multilayer wiring structure of a semiconductor device according to the present invention comprises: a substrate; two or more wiring layers formed on the substrate; an upper plug for electrically connecting a wiring formed at one of the wiring layers to the upper wiring; and a lower plug opposite to the upper plug with the wiring interposed, for electrically connecting the wiring to the lower wiring layer or to the substrate, wherein when viewed in the direction of vertical line of the substrate surface, the distance between center of contact surface between the upper plug and the wiring, and center of contact surface between the lower plug and the wiring is about 2/3 or more of the diameter of each of the upper and lower plugs.

Further, a multilayer wiring structure of a semiconductor device according to the present invention comprises: a substrate; two or more wiring layers formed on the substrate; an upper plug for electrically connecting a wiring formed at one of the wiring layers to the upper wiring layer; and a lower plug opposite to the upper plug with the wiring interposed, for electrically connecting the wiring to the lower wiring layer or to the substrate, wherein the upper plug is inserted from the top surface of the one wiring layer to a depth of about 1/3 or more of the thickness thereof, the one wiring layer has a part projecting into lower side and being in contact with said lower plug, and the height of the projecting part from the undersurface of the one wiring layer is about 1/3 or less of the diameter of each of the lower plugs.

Further, a multilayer wiring structure of a semiconductor device according to the present invention comprises: a substrate; two or more wiring layers formed on the substrate; an upper plug for electrically connecting a wiring formed at one of the wiring layers to the upper wiring layer; and a lower plug opposite to the upper plug with the wiring interposed, for electrically connecting the wiring to the lower wiring layer or to the substrate, wherein the wiring has no grain boundary in the region between the opposite upper and lower plugs.

Further, a multilayer wiring structure of a semiconductor device according to the present invention comprises: a substrate; two or more wiring layers formed on the substrate; an upper plug for electrically connecting a wiring formed at one of the wiring layers to the upper wiring layer; and a lower plug opposite to the upper plug with the wiring interposed, for electrically connecting the wiring to the lower wiring layer or to the substrate, wherein the difference in thermal expansion coefficient between the material of the wiring and the material of at least one of the upper and lower plugs is so small that no void may be generated in the region of the wiring between the opposite upper and lower plugs.

A multilayer wiring structure of a semiconductor device according to the present invention comprises: a substrate; two or more wiring layers formed on the substrate; an upper plug for electrically connecting a wiring formed at one of the wiring layers to the upper wiring layer; and a lower plug opposite to the upper plug with the wiring interposed, for electrically connecting the wiring to the lower wiring layer or to the substrate, wherein the one wiring layer has a layer of a high-melting-point metal or an alloy of high-melting-point metal on the top surface thereof, and the wiring is in contact with the upper plug through the layer of a high-melting-point metal or an alloy of high-melting-point metal.

Further, a multilayer wiring structure of a semiconductor device according to the present invention comprises; a substrate; two or more wiring layers formed on the substrate; an upper plug for electrically connecting a wiring formed at one of the wiring layers to the upper wiring layer; and a lower plug opposite to the upper plug with the wiring interposed, for electrically connecting the wiring to the lower wiring layer or to the substrate, wherein the one wiring layer has a layer of a high-melting-point metal on the undersurface thereof, and said layer of a high-melting-point metal has a thickness of not greater than 10 nm or not less than 80 nm.

Further, a method of producing a multilayer wiring structure of a semiconductor device according to the present invention comprises; a step of forming a first opening in a first insulating layer formed on a substrate and forming a lower plug in the first opening; a step of forming a wiring on the first insulating layer and the lower plug; and a step of forming a second insulating layer on the wiring, and forming, in the second insulating layer and the wiring, a second opening opposite to the first opening and with a depth of about ⅓ or more of the thickness of the wiring, and forming an upper plug in the second opening; at the lower plug forming step, a CMP or etching-back method being used such that the distance between top surface of the lower plug and top surface of the first insulating layer, is about ⅓ or less of the diameter of each of the upper and lower plugs.

Further, a method of producing a multilayer wiring structure of a semiconductor device according to the present invention comprises: a step of forming a first opening in a first insulating layer formed on a substrate and forming a lower plug in the first opening; a step of forming, on the first insulating layer and the lower plug, a wiring having a layer of aluminium or aluminium-alloy; and a step of forming a second insulating layer on the wiring, and forming; in the second insulating layer, a second opening opposite to the first opening, and forming an upper plug in the second opening; at the wiring forming step, the aluminium or aluminium-alloy layer of the wiring being formed, by sputtering, at a substrate temperature of about 200° C. or more such that the region of the wiring between the opposite upper and lower plugs, has no grain boundary.

Further a method of producing a multilayer wiring structure of a semiconductor device according to the present invention comprises; a step of forming a first opening in a first insulating layer formed on a substrate; a step of forming a lower plug in the first opening and forming a wiring on the first insulating layer; and a step of forming a second insulating layer on the wiring, and forming, in the second insulating layer, a second opening opposite to the first opening, and forming an upper plug in the second opening; at the lower plug and wiring forming step, a CVD method or a CVD and sputtering method being used such that aluminium or an aluminium alloy is deposited in the first opening and on the first insulating layer, thus forming the lower plug and the wiring.

Further, a semiconductor device according to the present invention comprises: a substrate; and three or more wiring layers formed on the substrate; a test pattern for reliability evaluation formed at the wiring layers; the test pattern comprising: an electrically isolated wiring formed at other wiring layer than the highest and lowest layers; an upper plug in contact with top surface of the wiring for electrically connecting the wiring to the upper wiring layer; and a lower plug in contact with the undersurface of the wiring for electrically connecting the wiring to the lower wiring layer, wherein the upper and lower plugs are opposite to each other with the wiring interposed, and when viewed in the direction of vertical line of the substrate, contact surface between the wiring and the upper plug overlaps with, at least partially, contact surface between the wiring and the lower plug.

BRIEF DESCRIPTION OF THE DRAWINGS

FIG. 2 is a characteristic view illustrating the problem to be solved by the present invention, in which

FIG. 10 is a view illustrating a test according to the third embodiment of the present invention; in which

DETAILED DESCRIPTION OF THE INVENTION

FIG. 1 illustrates the structure of a sample to be used for electrically detecting the effect of the stacked structure of a multilayer wiring structure of a semiconductor device.

Figure 1A:
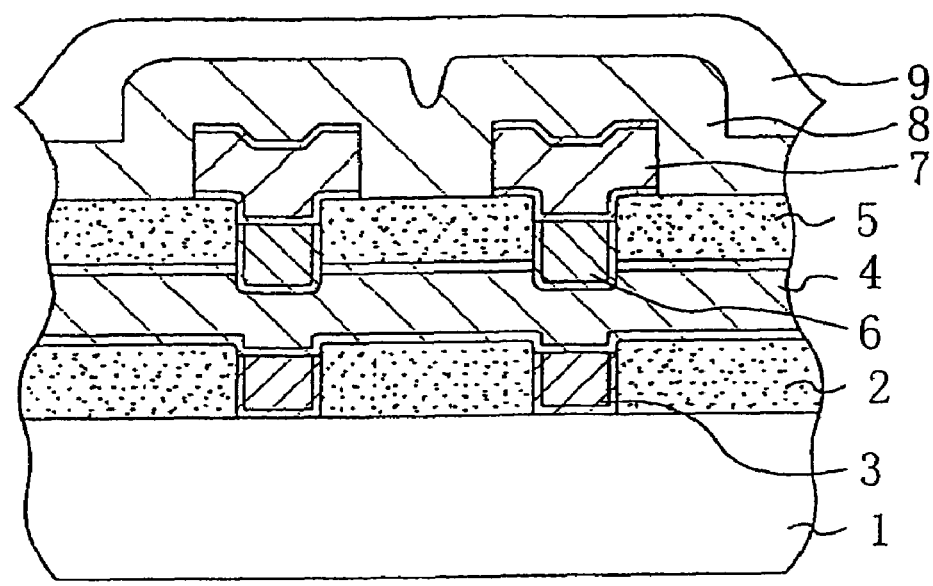
FIG. 1(a) is a section view of a sample for electrically detecting the effect of stacked structure in a multilayer wiring structure of a semiconductor device and FIG. 1(b) is a perspective view of a part of the sample in FIG. 1(a)

FIG. 1(a) is a section view of this sample. Shown in FIG. 1(a) are a semiconductor substrate 1, a first insulating layer 2, contact embedded metals (lower plugs) 3 made of W (tungsten) formed on a Ti/TiN two-lamination film, a first wiring 4 formed of a Cu-containing Al alloy formed above a Ti/TiN two-lamination film and above which a TiN film is formed, a second insulating layer 5, through-hole embedded metals (upper plugs) 6 each having a metal composition similar to contact embedded metal 3, second wirings 7 each having a metal composition similar to first wiring 4, a silicon nitride layer 8 serving as a protective layer, and a polyimide layer 9 as an LSI chip coat.

Figure 1B:
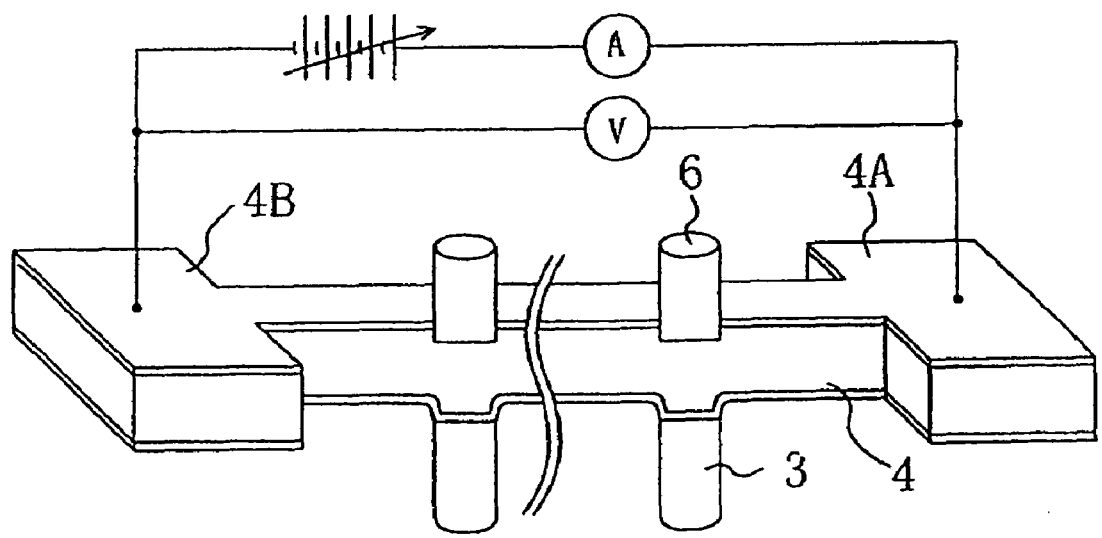

FIG. 1(b) is a perspective view of first wiring 4, and the contact embedded metal 3 and the through-hole embedded metal 6 respectively connected to the underside and top of the first wiring 4. The first wiring 4 has a wiring length of 31 mm and has 1,000 contact holes and 1,000 through-holes. Wiring widths of first wiring 4 are in the range from 0.4 to 1.0 μm and are respectively equal to the diameters of the corresponding contact holes and through-holes.

In FIG. 1(b), the characteristics of voltage and current are measured between pad portions 4A, 4B disposed at both ends of each first wiring 4. The measurement of characteristics of voltage and current refers to the measurement of resistance value of first wiring 4 provided at the underside and top thereof with contact embedded metal 3 and through-hole embedded metal 6, respectively. For semiconductor substrate 1 electrically connected to contact embedded metals 3 is made of Si and is higher in resistance value than first wiring 4 made of metal. And second wirings 7 electrically connected to through-hole embedded metal 6 are electrically independently arranged in its wiring layer.

Figure 2A:
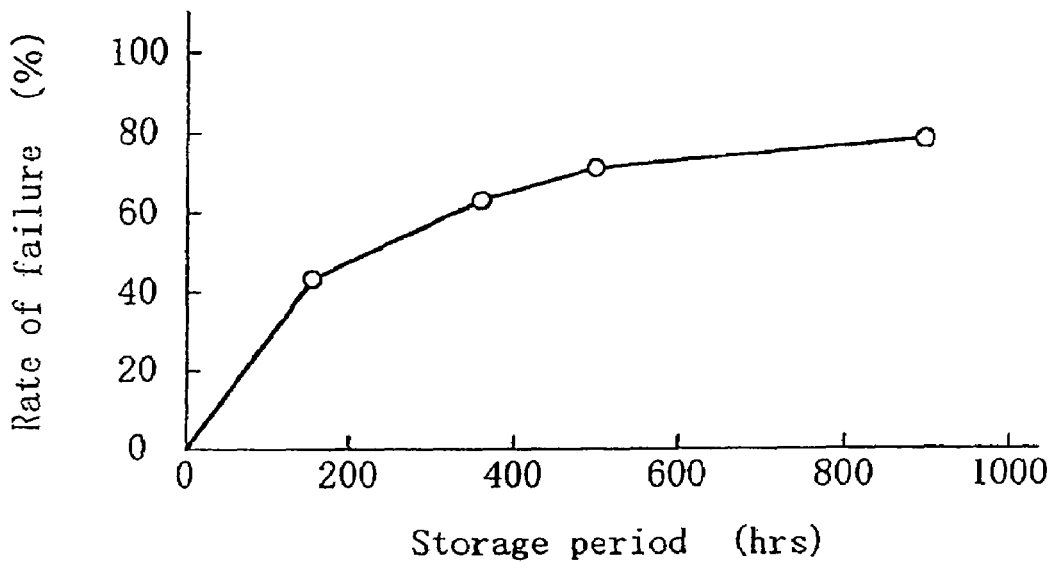
FIG. 2(a) is a graph illustrating the relationship between storage period at high temperature and rate of failure of samples showing in FIG. 1
Figure 2B:
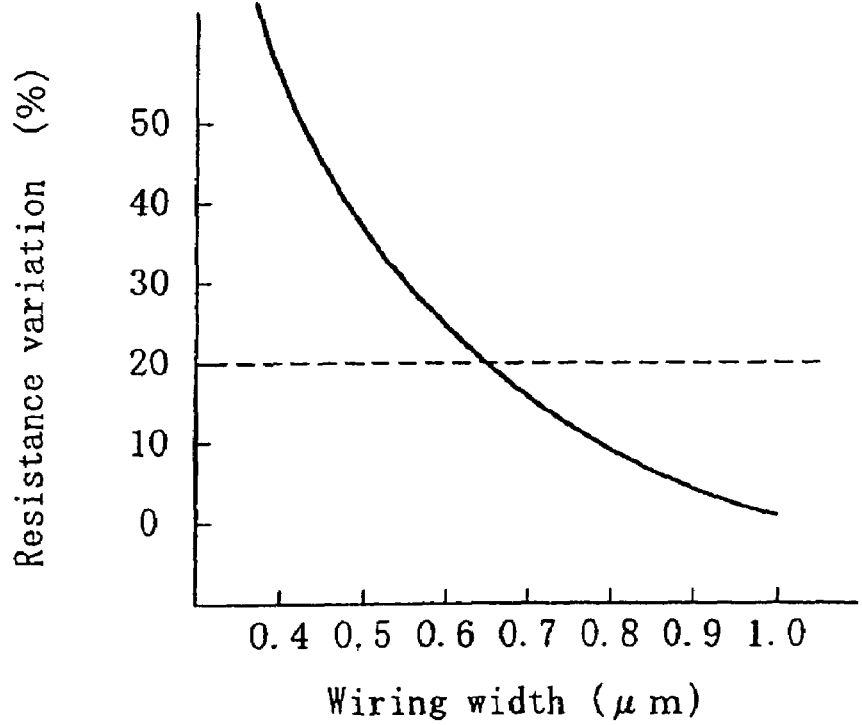
FIG. 2(b) is a graph illustrating the relationship between wiring width and resistance variation of the samples shown in FIG. 1 after storage at high temperature.

FIG. 2 illustrates the result of measurement on the characteristics of voltage and current between pad portions 4A, 4B, i.e., the resistance variations of first wirings 4, of samples shown in FIG. 1 before and after storage at around 250° C. FIG. 2(a) is a graph illustrating the relationship between storage period at about 250° C., and rate of wiring failure. In FIG. 2(a), ordinate axis represents rate of failure (%) while abscissa axis represents storage period (hrs). Here, rate of failure is obtained on the basis that wiring of which resistance variation exceeded 20%, is judged as failure. FIG. 2(b) is a graph illustrating the relationship between wiring width and resistance variation of samples after stored at about 250° C. for 1,000 hours. In FIG. 2(b), ordinate axis represents resistance variation (%) while abscissa axis represents wiring width (μm).

Figure 3:
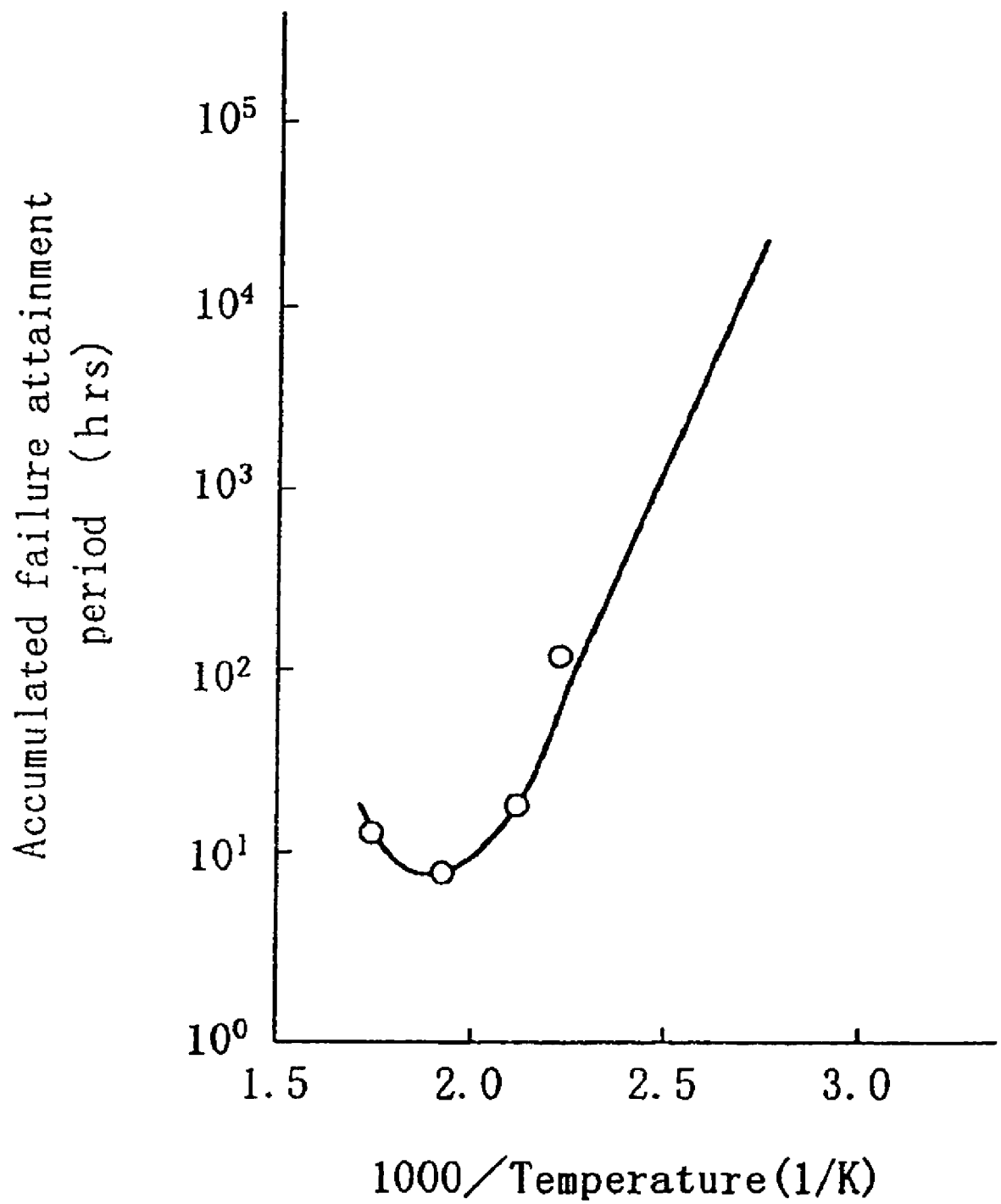
FIG. 3 is a characteristic view illustrating the problem to be solved by the present invention, showing the relationship between storage temperature and accumulated failure attainment period of the samples shown in FIG. 1.

FIG. 3 is a graph illustrating the relationship, in the samples shown in FIG. 1, between storing temperature and accumulated failure attainment period during which accumulated failure rate reached 0.1%. Likewise in FIG. 2, wiring of which resistance variation exceeded 20% is judged as failure. In FIG. 3, ordinate axis represents accumulated failure attainment period (hrs) while abscissa axis represents 1000/storing temperature (1/K). FIG. 3 shows that the accumulated failure attainment period is minimized in the vicinity of 250° C. It is understood that such a phenomenon occurs from an Al alloy migration failure due to stress, which is a kind of a so-called stress migration failure.

Figure 4:
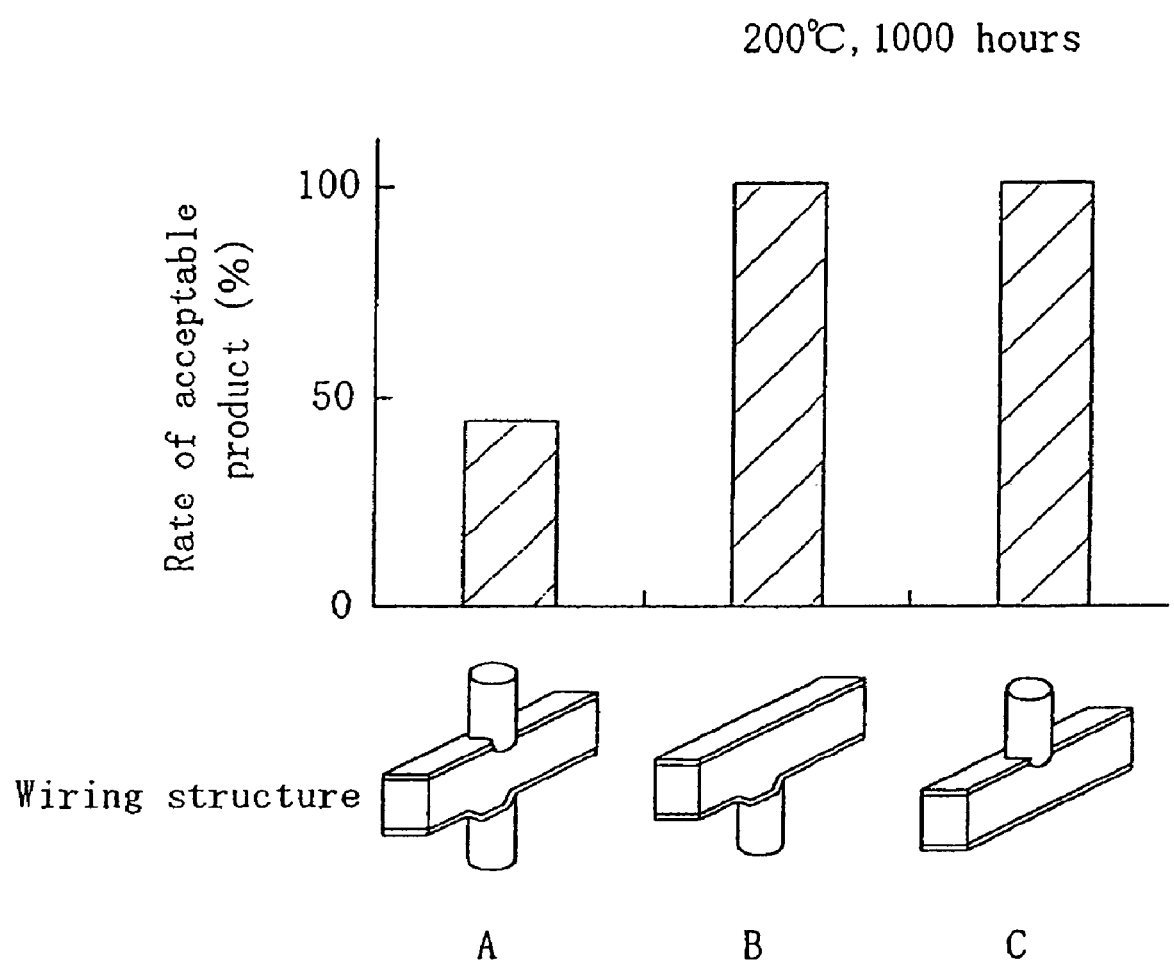
FIG. 4 is a characteristic view illustrating the problem to be solved by the present invention, showing the relationship between wiring structure and rate of acceptable product.

FIG. 4 is a view illustrating the relationship between wiring structure and rate of acceptable product. FIG. 4 shows the rate of acceptable product for three types of wiring structures, i.e., wiring structure A having an upper plug and a lower plug opposite to each other, wiring structure B having only a lower plug, and wiring structure C having only an upper plug, after storage at 200° C. for 1,000 hours. Here, rate of acceptable product is obtained on the basis that wiring of which resistance variation exceeded 20% is judged as failure. It is understood from FIG. 4 that the problem to be solved by the present invention is characteristic in the wiring structure having an upper plug and a lower plug opposite to each other.

Figure 5:
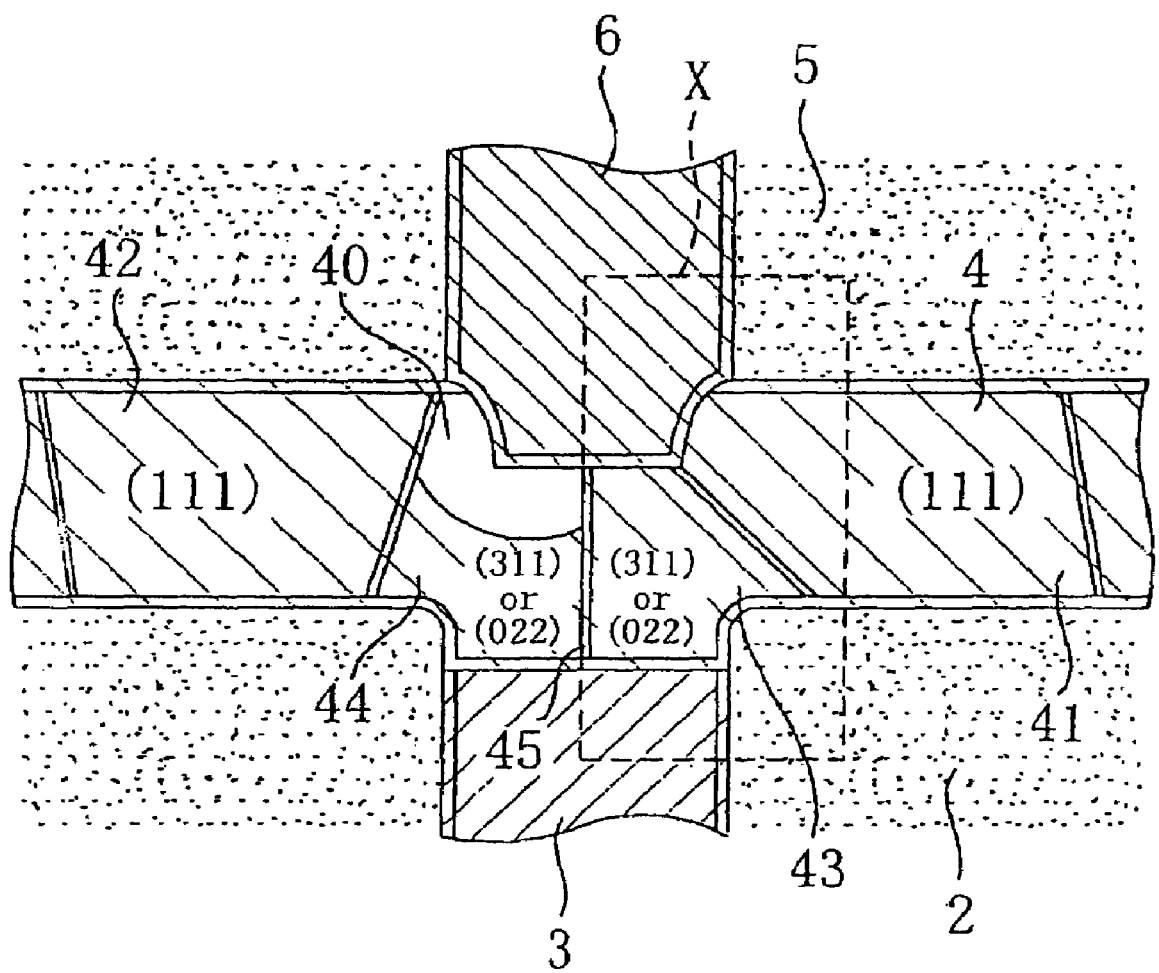
FIG. 5 is a section view illustrating the result of observation by transmission electron microscope of a wiring structure as shown in FIG. 1 that becomes failure after storage at high temperature.

FIG. 5 is a section view illustrating the result of observation by transmission electron microscope of a wiring structure having an upper plug and a lower plug opposite to each other, and of which resistance variation exceeded 20% after stored at 200° C. for 1000 hours. FIG. 5 also shows the result of measurement on microstructure of Al alloy of first wiring 4, using X-ray diffraction.

As shown in FIG. 5, a void 40 was observed in the portion of first wiring 4 between contact-hole embedded metal 3 serving as an upper plug and through-hole embedded metal 6 serving as a lower plug. The surface orientation of Al alloy of wiring portions 41, 42 between first insulating layer 2 and second insulating layer 5, was (111), while the surface orientation of Al alloy of wiring portions 43, 44 between contact embedded metals 3 and through-hole embedded metals 6, was (311) or (022). A grain boundary 45 exists in a region between contact hole embedded metal 3 and through-hole embedded metal 6. Thus, the size of grains in wiring portions 43, 44 is smaller than in wiring portions 41, 42.

Figure 6A:
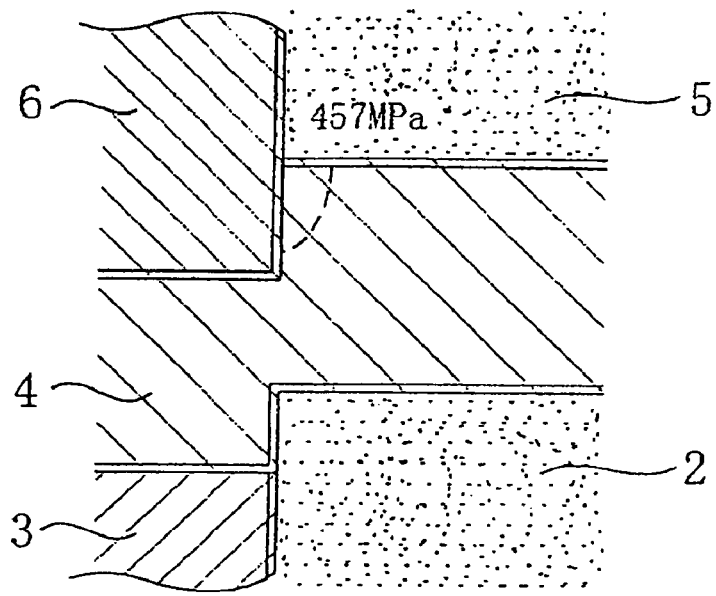
FIGS. 6(a) and 6(b) are views illustrating the result of simulation, using a finite-element method, of internal stress generated at temperature change in the wiring structure in FIG. 5.
Figure 6B:
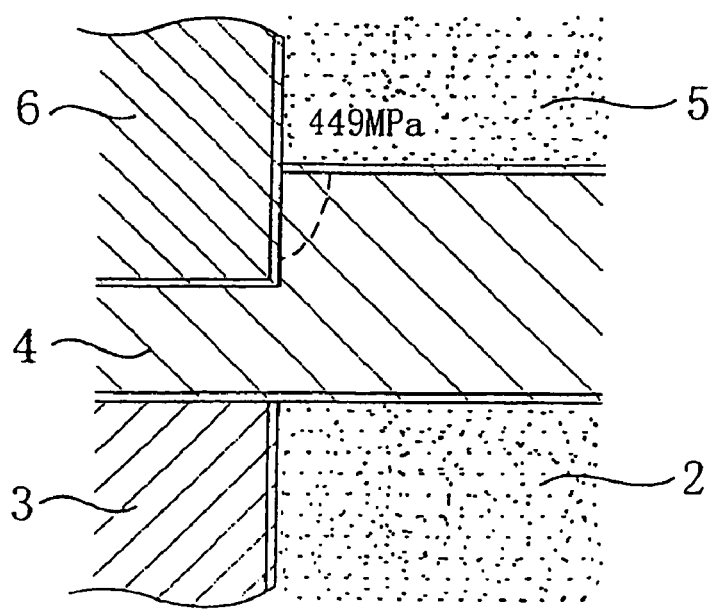

FIG. 6 is a view illustrating the result of simulation, using a finite-element method, of internal stress generated in a right-half region X of the region between contact hole embedded metal 3 and through-hole embedded metal 6 in the wiring structure in FIG. 5 when the temperature was changed from 400° C. to 25° C.

The stress applied to first wiring 4 at its flat portions was 200~300 MPa. On the contrary, the stress applied to the portion of first wiring 4 into which through-hole embedded metal 6 enters was much higher. More specifically, the stress was 457 MPa when the top of contact embedded metal 3 is lower the top of first insulating layer 2 (FIG. 6(a)), and the stress was 449 MPa when the top of contact embedded metal 3 is located at the same level of the top of first insulating layer 2 (FIG. 6(b)).

From these tests and simulation, the following factors would be considered to contribute to stress migration failure in multilayer wiring structure of a semiconductor device. When multilayer wiring structure is stored at high temperature, stress migration occurs, in the wiring portion between the opposite upper and lower plugs, particularly in which the upper plug enters into the wiring and strong stress is applied, because grain size is small and surface orientation is weak in stress such as (311) or (022) in the wiring portion.

The following description will discuss embodiments of the present invention with reference to the attached drawings.

Embodiment 1

A first embodiment of the present invention is arranged such that, in a wiring structure having an upper plug and a lower plug opposite to each other, the overlap rate between upper and lower plugs when viewed in the direction of vertical line of the substrate surface, is reduced to the extent that no voids are generated.

Figure 7:
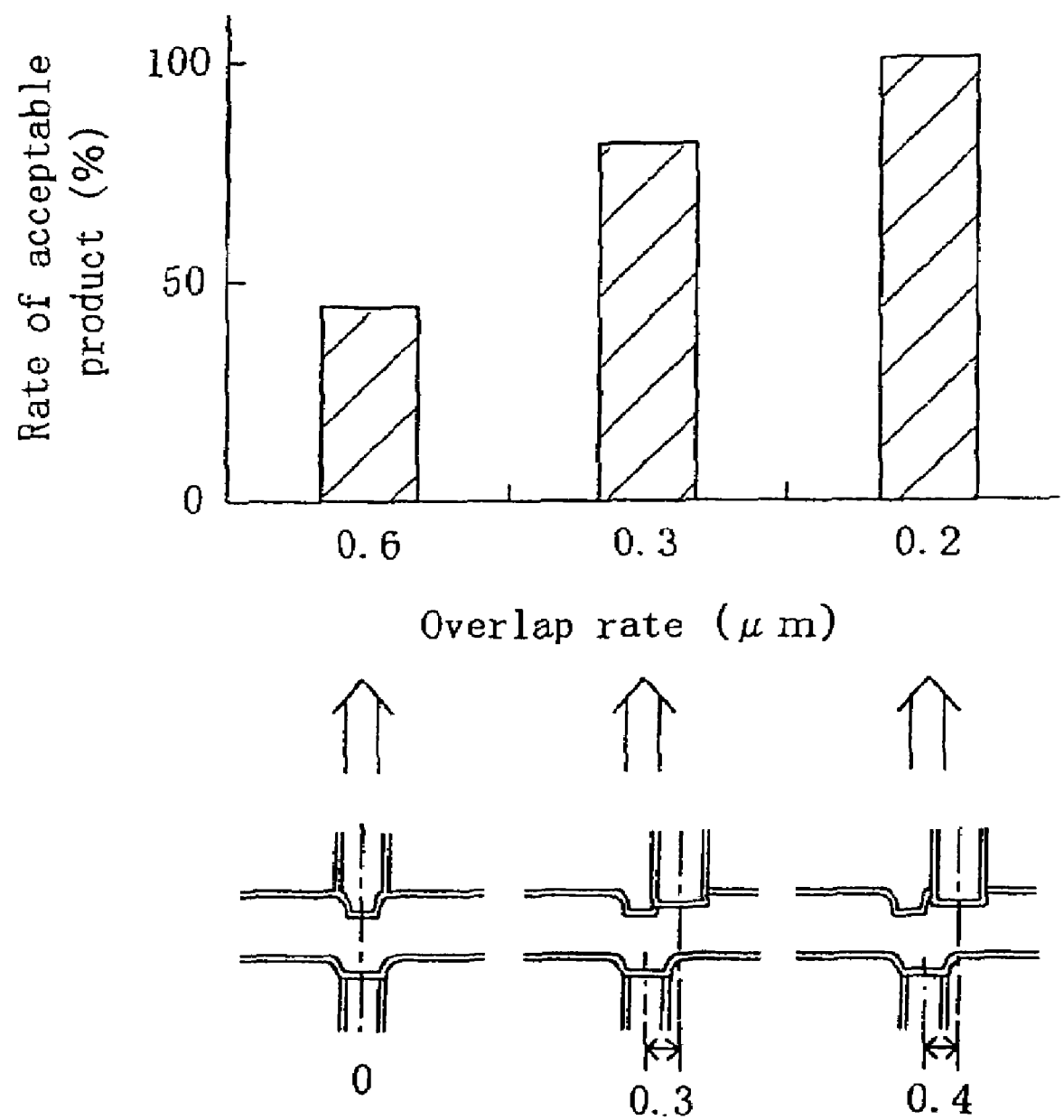
FIG. 7 is a graph illustrating a first embodiment of the present invention and shows the relationship between rate of acceptable product and overlap rate between upper and lower plugs.

FIG. 7 is a view illustrating the relationship, in wiring structure having an upper plug and a lower plug opposite to each other, between rate of acceptable product and overlap rate between the upper and lower plugs. In this embodiment, each of upper and lower plugs is 0.6 μm in diameter, and overlap rates are 0.6 μm, 0.3 μm, 0.2 μm (distances between center of contact surface between upper plug and wiring, and center of contact surface between lower plug and wiring are 0 μm, 0.3 μm, 0.4 μm). The rate of acceptable product is obtained on the basis that wiring of which resistance variation exceeded 20%, is judged as failure after storage at 200° C. for 1,000 hours.

As shown in FIG. 7, acceptable product is 100% when overlap rate is 0.2 μm. This shows that stress migration failure will not occur when overlap rate is not greater than 0.2 μm. Accordingly, by setting the distance between center of contact surface between upper plug and wiring, and center of contact surface between lower plug and wiring, to 0.4 μm or more, i.e., to ⅔ or more of the diameter of each of the upper and lower plugs, a good multilayer wiring structure in which a stress migration failure hardly occurs can be formed.

Embodiment 2

Figure 8A:
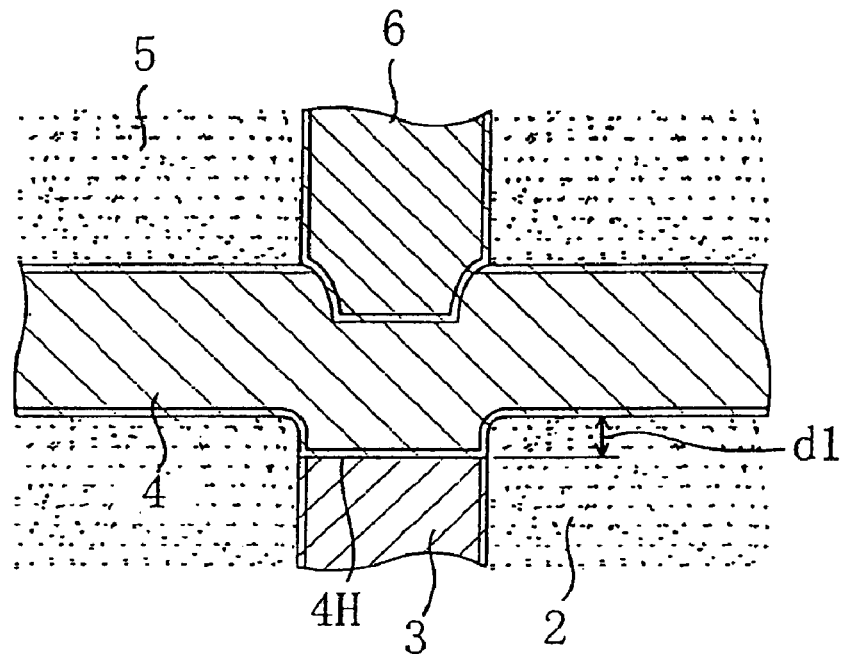
FIG. 8(a) is a section view of a multilayer wiring structure of a semiconductor device according to a second embodiment of the present invention.

FIG. 8(a) is a section view of a multilayer wiring structure of a semiconductor device according to a second embodiment of the present invention.

The multilayer wiring structure of a semiconductor device as shown in FIG. 8(a) is produced in the following manner. First, a contact opening as first opening is formed in a first insulating layer 2 on a semiconductor substrate by dry-etching, a Ti/TiN two-lamination film is formed by sputtering or the like, and W is then embedded in the contact opening by a CVD method. Then, W and the Ti/TiN two-lamination film were subjected to etching-back, and a contact embedded metal 3 is formed as a lower plug in the contact opening. Then, a Ti/TiN two-lamination film is formed, and a Cu-containing Al alloy is formed on this two-lamination film, and a TiN film is formed on the Al alloy, thus forming a first wiring 4. A second insulating layer 5 is formed on the first wiring 4. In a through-hole opening as second opening in the second insulating layer 5, a through-hole embedded metal 6 having a composition similar to contact embedded metal 3, is formed in a manner similar to forming the contact embedded metal 3, the through-hole embedded metal 6 serving as an upper plug. To lower the contact resistance between first wiring 4 and through-hole embedded metal 6, through-hole embedded metal 6 is inserted into first wiring 4 to a depth of about ⅓ or more of the thickness of first wiring 4 from the top thereof.

Figure 8B:
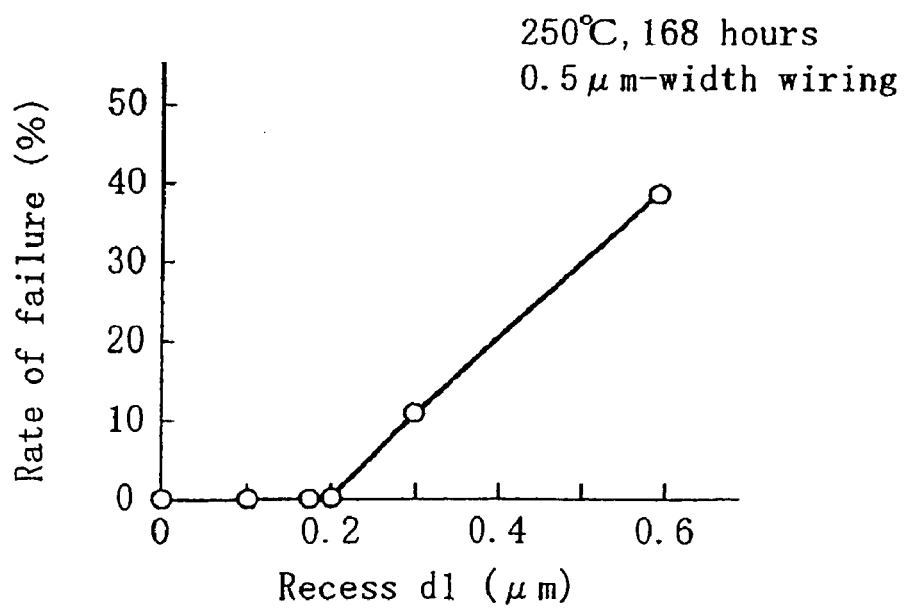
FIG. 8(b) is a graph illustrating the relationship between recess d1 and rate of failure.

A plurality of samples each of which had the multilayer wiring structure as shown in FIG. 8(a), and which were different in recess d1 by changing the amount of over-etching at etching-back of W and Ti/TiN two-lamination film were produced. The recesses d1 is the height of projecting part 4H that projects into lower side and is in contact with contact embedded metal 3, from the under surface of first wiring 4. FIG. 8(b) is a graph illustrating rate of failure for these samples after storage at 250° C. for 168 hours. Rate of failure is obtained on the basis that samples of which resistance variation exceeded 20%, is judged as failure. In FIG. 8(b), ordinate axis represents rate of failure (%) while abscissa axis represents recess d1 (μm). Each of upper and lower plugs is 0.6 μm in diameter.

As apparent from FIG. 8(b), when recess d1 is not greater than 0.2 μm, rate of failure is 0% and stress migration failure has not occurred. Observation by a scanning electron microscope of samples in section after measurement of rate of failure shows the following. In each sample of which the recess d1 is larger than 0.2 μm, a grain boundary is almost always present in the region of first wiring 4 above contact embedded metal 3. On the other hand, in each sample of which the recess d1 is not greater than 0.2 μm, a grain boundary is hardly present in the region of first wiring 4 above contact embedded metal 3 and the grain size in this region is substantially equal to in other region.

From the foregoing, the recess d1 of 0.2 μm would be the border line of whether or not a stress migration failure occurs. Accordingly, when recess d1 is brought to 0.2 μm or less, i.e., to about ⅓ or less of the diameter of each of upper and lower plugs, a good multilayer wiring structure in which a stress migration failure hardly occurs can be formed.

In the foregoing, the description has been made of the case where an etching-back method using dry-etching is employed for forming contact embedded metal 3 and through-hole embedded metal 6. However, when the etching-back method is used, a residue readily remains, often resulting in over-etching. Thus, the recess d1 tends to be increased. On the other hand, when forming the contact embedded metal 3 and the through-hole embedded metal 6 with the use of a CMP (Chemical Mechanical Polishing) method, the recess d1 can be controlled in size with high precision. Therefore, there can securely be formed a multilayer wiring structure of a semiconductor device according to the second embodiment.

Embodiment 3

Figure 9A:
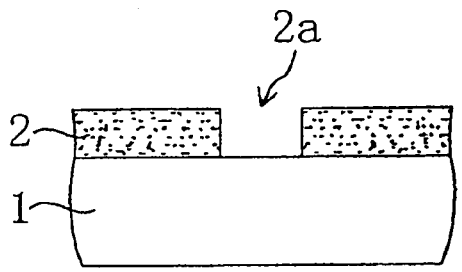
FIG. 9(a) to FIG. 9(f) are section views illustrating a method of producing a multilayer wiring structure of a semiconductor device according to a third embodiment of the present invention.
Figure 9B:
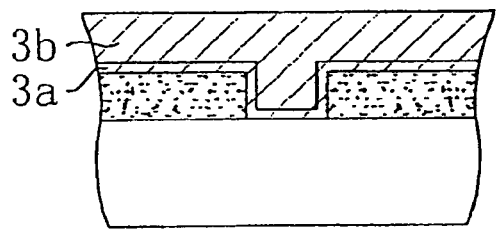
Figure 9C:
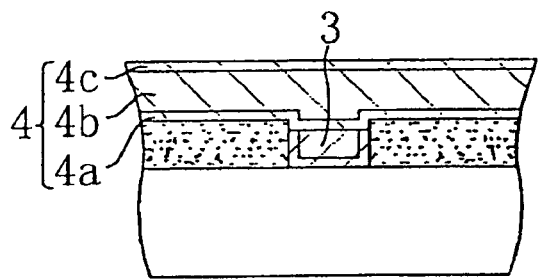

FIG. 9(a) to FIG. 9(f) are section views of the multilayer wiring structure of a semiconductor device at the respective steps of a production method according to a third embodiment of the present invention. As shown in FIG. 9(a), a contact opening 2a is formed in a first insulating layer 2 on a semiconductor substrate 1. As shown in FIG. 9(b), a W layer 3b is then formed on a Ti/TiN two-lamination layer 3a. Then, as shown in FIG. 9(c), the Ti/TiN two-lamination layer 3a and the W layer 3b on the first insulating layer 2, are etched such that the Ti/TiN two-lamination layer 3a and the W layer 3b remain only in the contact opening 2a, thus forming a contact embedded metal 3. Formed on the contact embedded metal 3 is a Ti/TiN two-lamination layer 4a, on which formed is a Cu-containing Al alloy 4b, on which a TiN layer 4c is formed. Thus, a first wiring 4 is formed.

The Al alloy 4b is formed by sputtering at a deposition temperature of not less than 200° C. By depositing Al alloy 4b at temperature of not less than 200° C., the crystal of Al alloy 4b grows during deposition. Accordingly, Al alloy 4b is formed to fill the recess around contact opening 2a. Thus, the portion of Al alloy 4b on contact opening 2a becomes thicker than other portion of Al alloy 4b.

Figure 9D:
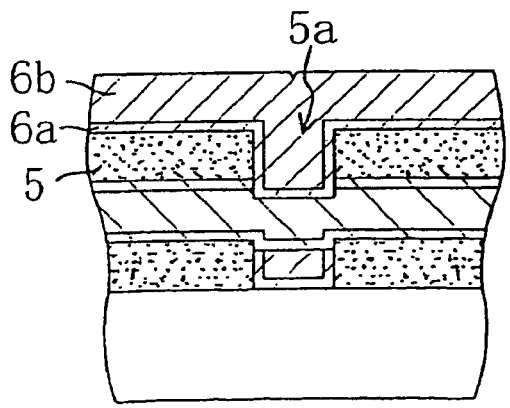

As shown in FIG. 9(d), a second insulating layer 5 is formed on the first wiring 4. A through-hole opening 5a is formed in the second insulating layer 5. Then, a W layer 6b is formed on a Ti/TiN two-lamination layer 6a. The through-hole opening 5a enters into the first wiring 4. However, provision is made such that the depth of that portion of the through-hole opening 5a entering into the first wiring 4, is equal to or smaller than the difference in level between the top of the contact embedded metal 3 and the top of that portion of the first insulating layer 2 around the contact opening 2a. By forming the through-hole opening 5a in this manner, the depth of that portion of the first wiring 4 on the contact embedded metal 3 is equal to or greater than the depth of the other portion of the first wiring 4.

Figure 9E:
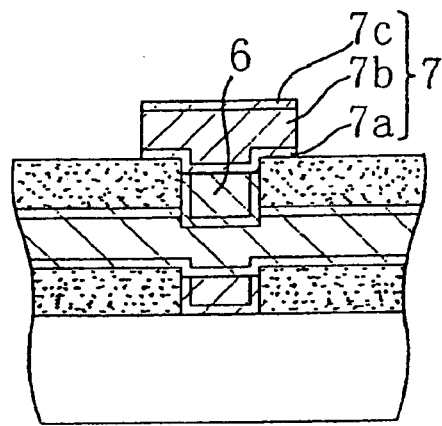
Figure 9F:
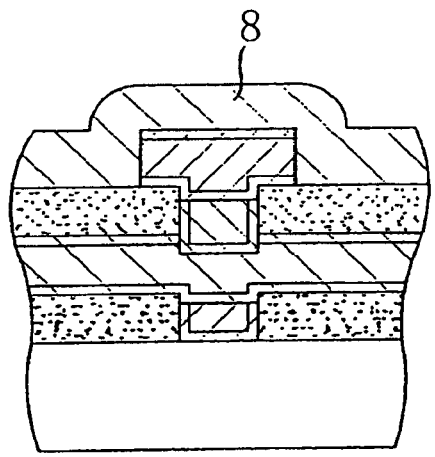

As shown in FIG. 9(e), the Ti/TiN two-lamination layer 6a and the W layer 6b on the second insulating layer 5 are etched such that the Ti/TiN two-lamination layer 6a and the W layer 6b remain only in the through-hole opening 5a, thus forming a through-hole embedded metal 6. Formed on the through-hole embedded metal 6 is a Ti/TiN two-lamination layer 7a, on which formed is a Cu-containing Al alloy 7b, on which a TiN layer 7c is then formed. Thus, a second wiring 7 is formed. As shown in FIG. 9(f), a silicon nitride layer 8 is then formed as a protective layer by a plasma CVD method.

In the multilayer wiring structure of a semiconductor device thus produced, that portion of the Al alloy 4b of the first wiring 4 on the contact embedded metal 3 has a thickness equal to or greater than that of other portion of the Al alloy 4b. Likewise in the second embodiment, a grain boundary hardly existed in that portion of the first wiring 4 on the contact embedded metal 3, i.e., that portion of the Al alloy 4b held by and between the upper- and lower-layer-side plugs opposite to each other. Further, the sizes of the crystal grains in this portion were substantially equal to those in other portion. Thus, likewise in the second embodiment, the structure according to the third embodiment exhibited no increase in wiring resistance due to stress migration failure after the structure had been stored at high temperature.

Figure 10A:
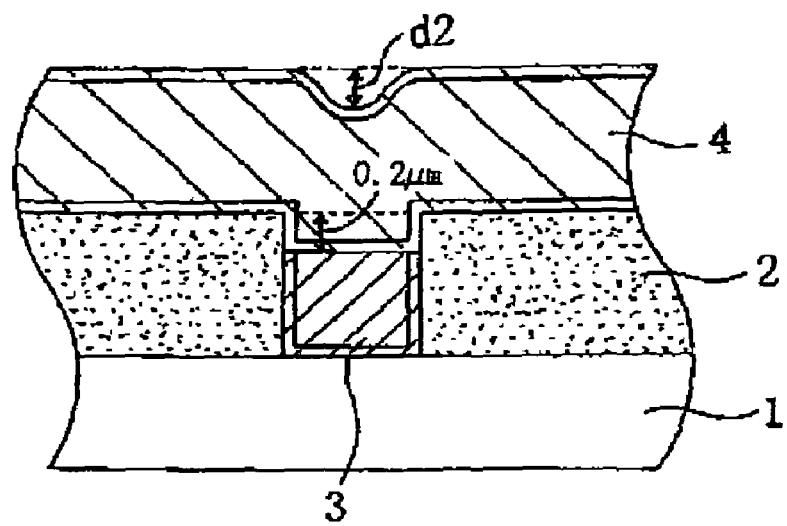
FIG. 10(a) is a view illustrating the sectional structure of a sample used in the test and FIG. 10(b) is a graph illustrating the relationship between deposition temperature at sputtering and depth d2 of wiring recess on lower plug.
Figure 10B:
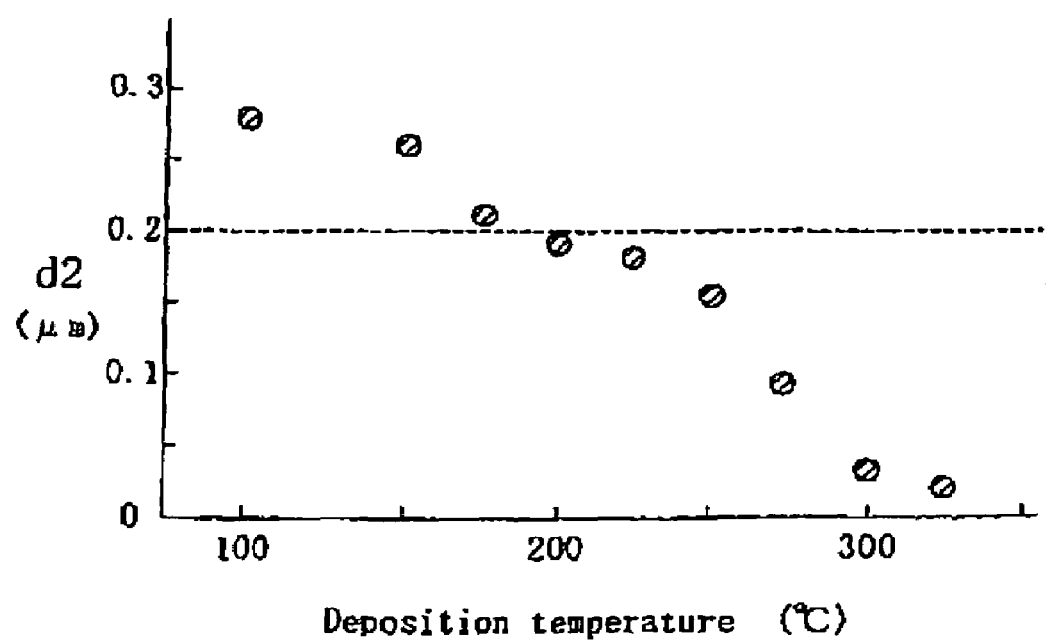

FIGS. 10(a) and 10(b) are views illustrating the relationship between deposition temperature at sputtering and the depth of the portion of first wiring 4 between upper and lower plugs opposite to each other. FIG. 10(a) shows the sectional structure of a sample used in the test. A contact opening having a diameter of 0.6 μm was formed in first insulating layer 2 having a thickness of 0.7 μm on semiconductor substrate 1, and in this contact opening, contact embedded metal 3 is formed of W on the Ti/TiN two-lamination film. The distance between the underside of first wiring 4 and the top of contact embedded metal 3 is 0.2 μm. Formed on contact embedded metal 3 were a Ti film having a thickness of 50 nm, a Cu-containing Al alloy having a thickness of 600 nm and a TiN film having a thickness of 30 nm. For the test, the samples were produced at a variety of Al alloy deposition temperatures, and the depth d2 of concave portion of first wiring 4 on contact embedded metal 3, was measured through an SEM observation in section.

FIG. 10(b) shows the experiment result. To make the thickness of portion of Al alloy of first wiring 4 on contact opening, equal to or greater than that of other portion of Al alloy, it is required that depth d2 is not greater than 0.2 μm. From FIG. 10(b), depth d2 is not greater than 0.2 μm when Al alloy deposition temperature is not less than 200° C. Then, the Al alloy deposition temperature would preferably be not less than 200° C.

Embodiment 4

Figure 11A:
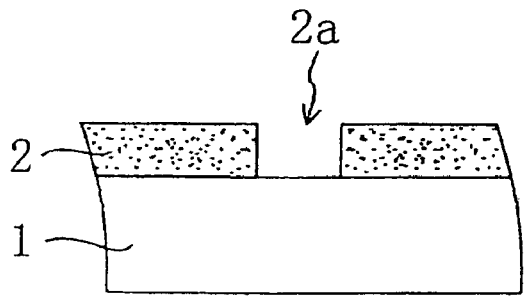
FIG. 11(a) to FIG. 11(e) are section views illustrating a method of producing a multilayer wiring structure of a semiconductor device according to a fourth embodiment of the present invention.
Figure 11B:
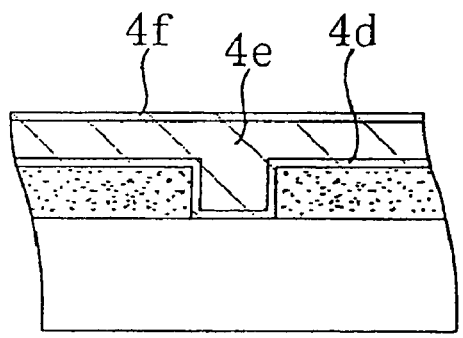

FIG. 11(a) to FIG. 11(e) are section views of the multilayer wiring structure of a semiconductor device at the respective steps of a production method according to a fourth embodiment of the present invention. As shown in FIG. 11(a), a contact opening 2a as first opening was formed in a first insulating layer 2 on a semiconductor substrate 1. As shown in FIG. 11(b), a Ti film 4d was formed on the first insulating layer 2. Using a CVD method at deposition temperature of 260° C. with dimethyl aluminium hydride used as material gas, an aluminium film in a thickness of 100 nm was deposited on the Ti film 4d. Then, a Cu-containing Al alloy was deposited in a thickness of 500 nm at deposition temperature of 400° C. by sputtering, thus forming a CVD aluminium-Al alloy layer 4e. Then, a TiN film 4f was formed. The Ti film 4d, the CVD aluminium-Al alloy layer 4e and the TiN film 4f were processed in the form of a first wiring 4. Since the aluminium film was formed using a CVD method, contact opening 2a was filled with aluminium. Accordingly, the portion of first wiring 4 on contact opening 2a was sufficiently thicker than the other portion of first wiring 4.

Figure 11C:
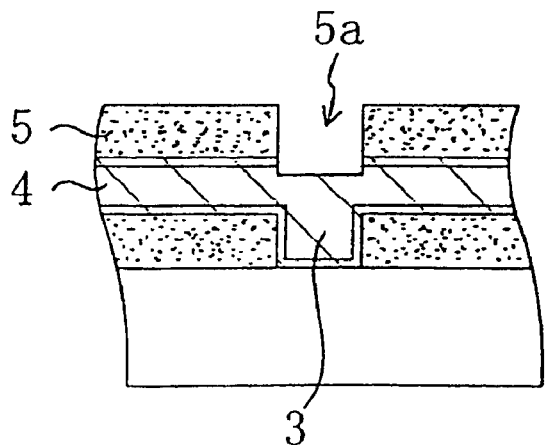
Figure 11D:
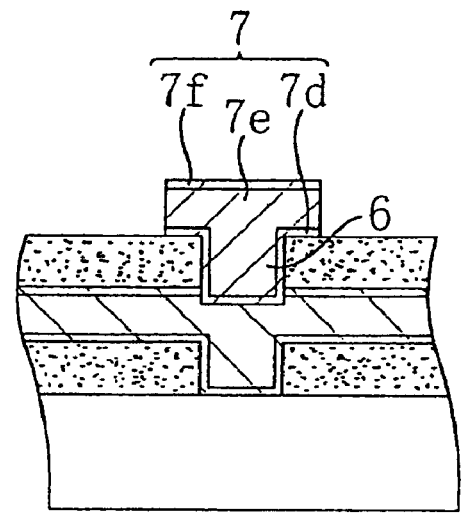
Figure 11E:
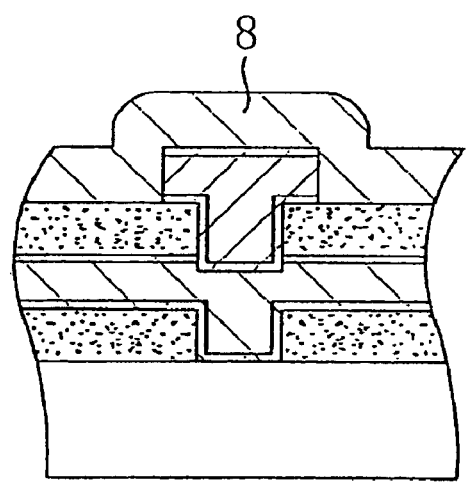

As shown in FIG. 11(c), a second insulating layer 5 was formed on the first wiring 4, and a through-hole opening 5a as second opening was formed in second insulating layer 5. As shown in FIG. 11(d), a CVD aluminium-Al alloy layer 7e was formed on a Ti film 7d, and a TiN film 7f was then formed on CVD aluminium-Al alloy layer 7e. Ti film 7d, the CVD aluminium-Al alloy layer 7e and TiN film 7f were processed in the form of a second wiring 7. As shown in FIG. 11(e), a silicon nitride layer 8 was formed as a protective layer by a plasma CVD method.

In such a multilayer wiring structure of a semiconductor device, both a first wiring 4 and a contact embedded metal 3 & a through-hole embedded metal 6 are made of an Al alloy. More specifically, a wiring 4 and the upper and lower plugs opposite to each other with this wiring interposed, are made of the same material. In such a structure, the stress applied to the portion between upper and lower plugs is remarkably smaller than that in a structure in which upper and lower plugs are made of metal (e.g., W) different from the material of wiring. Accordingly, the structure according to the fourth embodiment exhibited no increase in wiring resistance due to stress migration failure after storage at high temperature.

According to the fourth embodiment, contact opening 2a and through-hole opening 5a were filled with an Al alloy by CVD and sputtering. However, such filling can be made using CVD only. Alternatively, an Al alloy may be formed by sputtering and then heated or pressurized, causing the Al alloy to flow and fill contact opening 2a and through-hole opening 5a.

Further, even though upper and lower plugs are different in material from wiring, stress migration failure very seldom occurs as far as the difference in thermal expansion coefficient between the materials of wiring and either of upper and lower plugs is small to the extent that no voids are generated during storage at high temperature.

Embodiment 5

Figure 12:
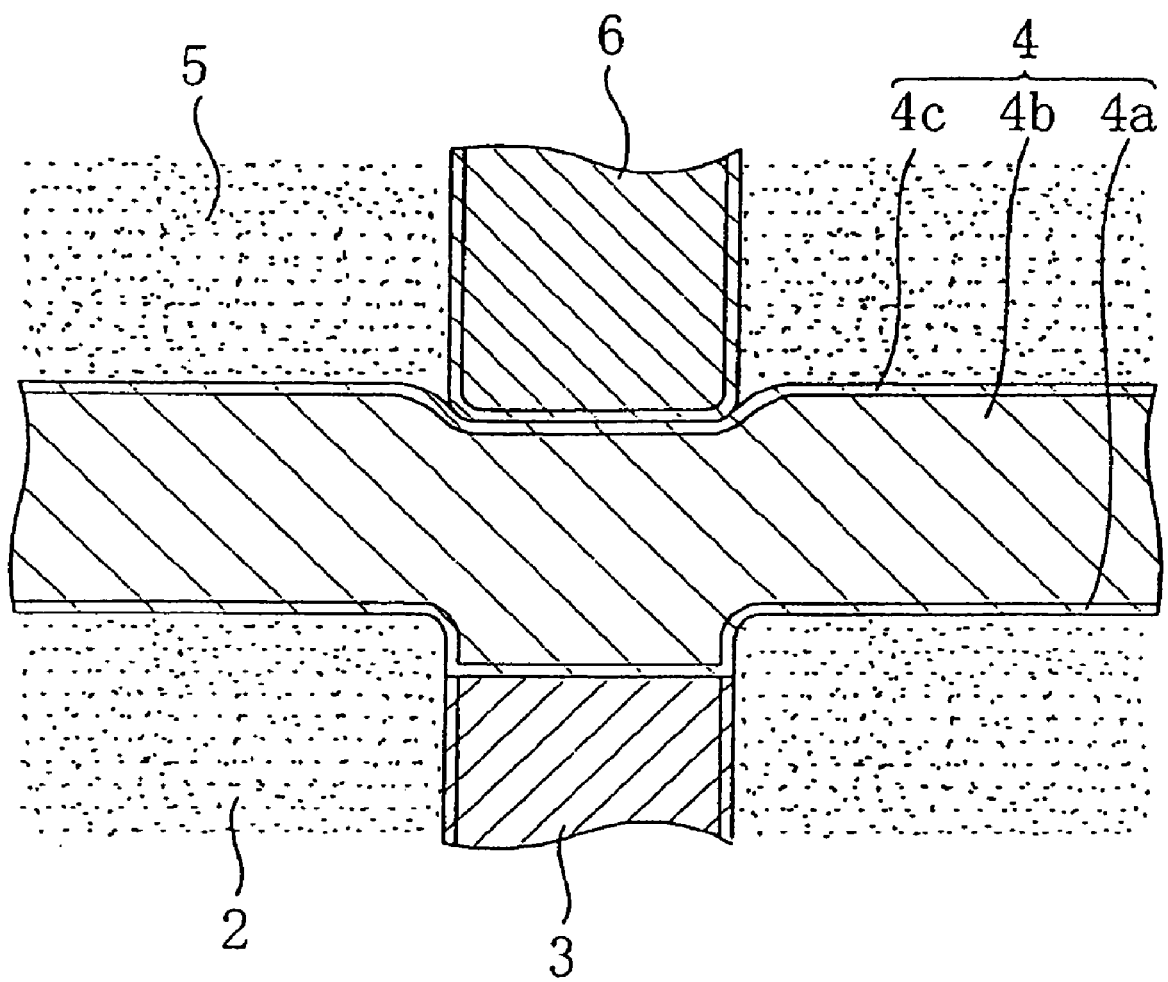
FIG. 12 is a section view of a multilayer wiring structure of a semiconductor device according to a fifth embodiment of the present invention.

FIG. 12 is a partial enlarged view of a multilayer wiring structure of a semiconductor device according to a fifth embodiment of the present invention, illustrating the portion of a first wiring 4 between a contact embedded metal 3 and a through-hole embedded metal 6. In the multilayer wiring structure in FIG. 12, the first wiring 4 comprises a Ti film 4a, a Cu-containing Al alloy 4b and a TiN film 4c as high-melting-point metal or high-melting-point metal alloy which are formed in lamination. First wiring 4 is in contact with through-hole embedded metal 6 serving as an upper plug through TiN film 4c.

The multilayer wiring structure in FIG. 12 is basically produced through steps similar to the third embodiment.

However, when forming a through-hole opening 5a in second insulating layer 5 by dry-etching or the like, TiN layer 4c of first wiring 4 is not removed but remains.

According to the multilayer wiring structure of the fifth embodiment, first wiring 4 is in contact with through-hole embedded metal 6 through TiN film 4c. This TiN film 4c lessens the stress from the through-hole embedded metal 6. This restrains the generation of voids, thus preventing the resistance increase due to stress migration.

Embodiment 6

Figure 13:
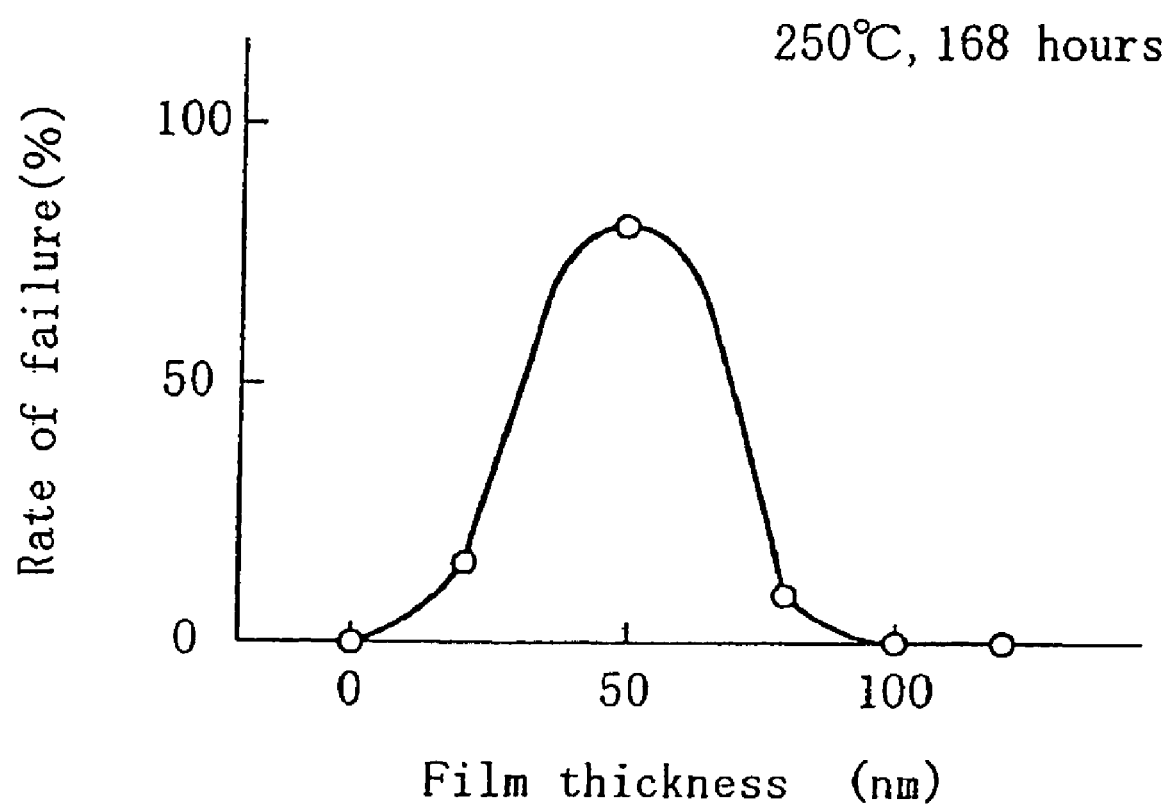
FIG. 13 is a graph illustrating a sixth embodiment of the present invention and shows the relationship between rate of failure and thickness of Ti layer serving as the lowest layer of the wiring.

There were produced samples shown in FIG. 1(a) with Ti film as high-melting-point metal film, instead of the lowest Ti/TiN two-lamination film of first wiring 4, and rate of failure was measured for the samples per thickness of Ti film in the range of 0 to 120 nm. FIG. 13 is a graph illustrating, as the results of measurement, the relationship between the rate of failure and the thickness of Ti film. The rate of failure was obtained on the basis that sample of which resistance variation exceeded 20% was judged as failure after storage at 250° C. for 168 hours.

As understood from FIG. 13, rate of failure is maximized when the thickness of Ti film 4a is 50 nm, and rate of failure is equal to zero when the thickness of Ti film 4a is 0 nm and not less than 100 nm. The following would be considered as the reason of the relationship between thickness of Ti film and rate of failure as shown in FIG. 13. The stress applied to first wiring 4 is lessened by Ti film, and this stress lessening effect is increased with an increase in film thickness. On the other hand, when Ti film 4a is present, Si in the aluminium alloy is sucked by Ti film 4a, causing vacancy to be readily generated in aluminium alloy. It is therefore considered that the results as shown in FIG. 13 were obtained based on the balance between stress lessening effect and the susceptibility to vacancy generation in the aluminium alloy.

Accordingly, by excluding the range from 10 nm to 80 nm as the thickness of Ti film 4a, i.e., by setting the thickness of Ti film 4a to 10 nm or less, or to 80 nm or more, good multilayer wiring structures in which stress migration failure hardly occurs can be formed.

In each of the first to sixth embodiments, the description has been made of the two-layer wiring structure, but the present invention can also be achieved in a multilayer wiring structure having three or more layers.

Embodiment 7

Figure 14:
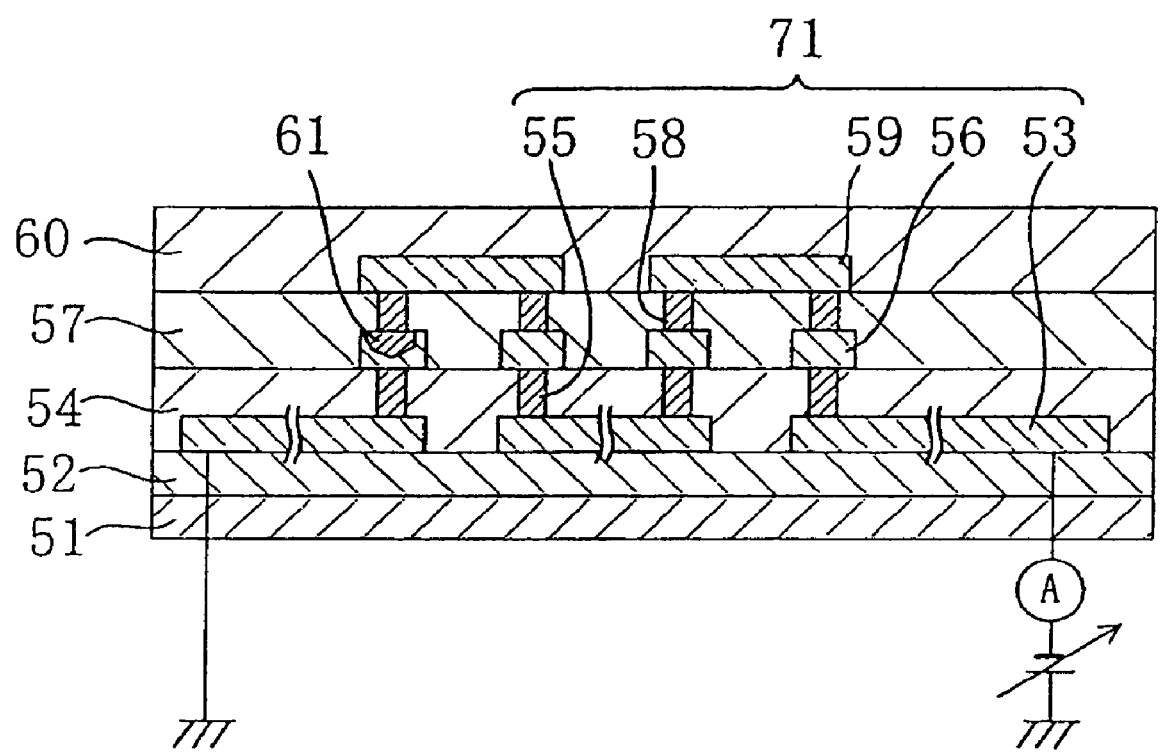
FIG. 14 is a section view of a semiconductor device according to a seventh embodiment of the present invention.

FIG. 14 is a section view of a semiconductor device according to a seventh embodiment of the present invention. Shown in FIG. 14 are a silicon substrate 51, a silicon oxide layer 52, a plurality of first-layer aluminium alloy wirings 53 each having a width of 2 µm and a length of 10 µm serving as lower-layer wirings, a silicon oxide layer 54 formed on the first-layer aluminium alloy wirings 53, W plugs 55 serving as lower plugs each having a diameter of 0.5 µm for electrically connecting the first-layer aluminium alloy wirings 53 to a plurality of second-layer aluminium alloy wirings 56 serving as 2 µm-square wirings, a silicon oxide layer 57 formed on the second-layer aluminium alloy wirings 56, W plugs 58 serving as upper plugs each having a diameter of 0.5 µm for electrically connecting the second-layer aluminium alloy wirings 56 to a plurality of third-layer aluminium alloy wirings 59 serving as upper-layer wirings each having a width of 2 µm and a length of 10 µm, and a silicon oxide layer 60 formed on the third-layer aluminium alloy wirings 59. A void 61 is generated and grows in a second-layer aluminium alloy wiring 56.

As shown in FIG. 14, in the semiconductor device according to the seventh embodiment of the present invention, the first-layer aluminium alloy wirings 53, the second-layer aluminium alloy wirings 56 and the third-layer aluminium alloy wirings 59 mutually insulated by the silicon oxide layers 54, 57, are electrically connected in series through the W plugs 55, 58. A test pattern 71 for measuring a via resistance for reliability evaluation, is formed by these serially connected first-layer aluminium alloy wirings 53, second-layer aluminium alloy wirings 56 and third-layer aluminium alloy wirings 59, and the W plugs 55, 58.

The resistance value of the test pattern 71 is a sum of the resistance values of the aluminium alloy wirings 53, 56, 59 and the resistance values of the W plugs 55, 58. When it is now supposed that the sheet resistance of each of the aluminium alloy wirings 53, 56, 59 is equal to 100 mΩ/□, that the resistance value of each of the W plugs 55, 58 is equal to 1Ω, and that the number of each of the W plugs 55, 58 is 1,000, the resistance value of the test pattern 71 in a normal mode is equal to 2,500Ω.

According to the seventh embodiment, the second-layer aluminium alloy wirings 56 receive stress from the upper and lower W plugs 55, 58 since the test pattern 71 has a stacked via structure. When the void 61 grows in the second-layer aluminium alloy wiring 56 due to a stress migration phenomenon, the test pattern 71 is accordingly increased in resistance value. Therefore, by measuring the resistance value of the test pattern 71, it is possible to detect a disconnection of the second-layer aluminium alloy wiring 56 in the vicinity of plugs.

FIG. 14 shows the case in which the void 61 is generated in the top of a second-layer aluminium alloy wiring 56. In the arrangement of test pattern 71 of the seventh embodiment, however, the disconnection can be detected even though such a void is generated in the bottom of a second-layer aluminium alloy wiring 56.

Figure 15:
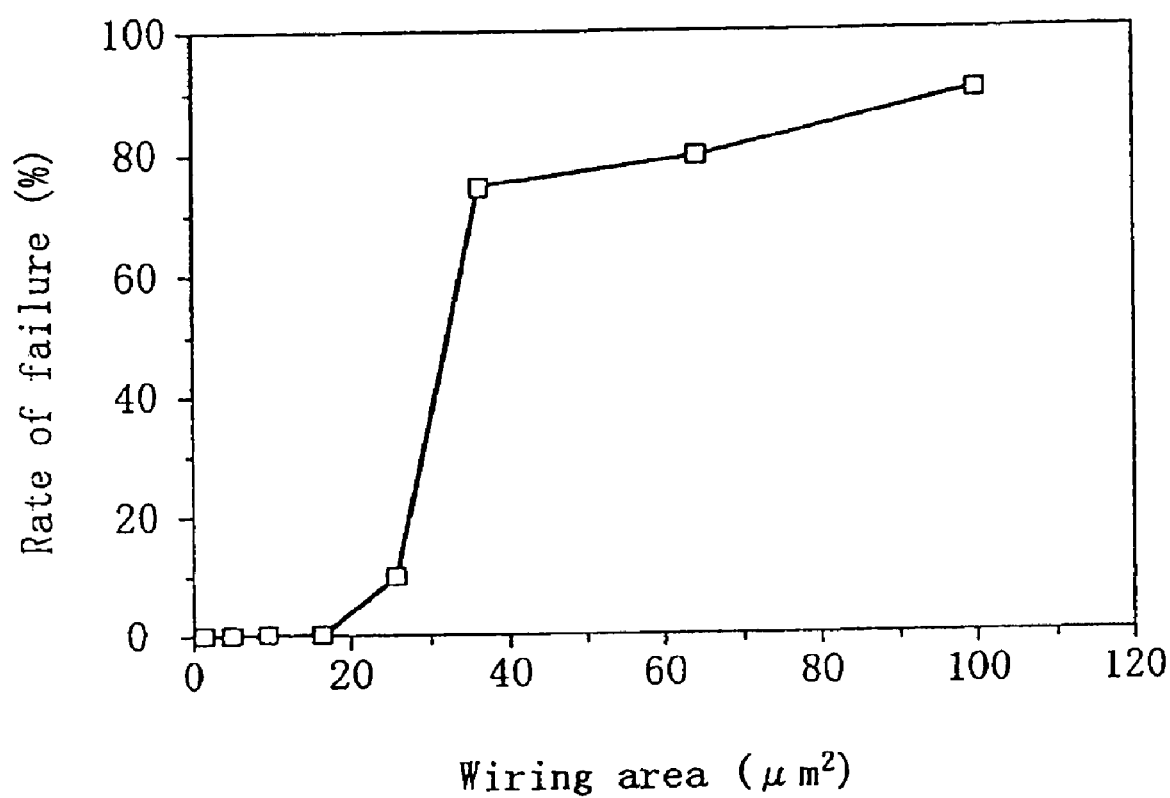
FIG. 15 is a graph illustrating the dependency of stress migration failure upon the wiring area in the semiconductor device according to the seventh embodiment of the present invention.

FIG. 15 is a graph illustrating the dependency of stress migration failure upon the wiring area in the semiconductor device according to the seventh embodiment in FIG. 14. Semiconductor devices each having the structure in FIG. 14, were stored at 250° C. for 1,000 hours and the increase rates of the resistance values of their test patterns 71 were measured. The rate of failure was obtained on the basis that semiconductor devices of which increase rate was not less than 20%, were judged as failure. As a parameter, the area of each second-layer aluminium alloy wiring 56 was changed in the range from 1 µm² to 100 µm². In FIG. 15, ordinate axis represents rate of failure (%) after storage for 1,000 hours while abscissa axis represents the area (µm²) of each second-layer aluminium alloy wiring 56, i.e., each wiring in contact at its top and underside with plugs. Each wiring thickness was 0.6 µm.

As shown in FIG. 15, semiconductor devices became defective when the area of each second-layer aluminium alloy wiring 56 in contact at its top and underside with plugs, was not less than 20 µm². A void generated in a wiring grows when crystal vacancies have been collected. When the wiring volume is small, no void is increased in size of not less than 0.5 µm which will result in a failure, even though all crystal vacancies in a wiring are collected. As understood from FIG. 15, when the area of a 0.6 µm-thick wiring is not less than 20 µm², i.e., when the wiring volume is not less than 12 µm³, it is possible to detect, with high sensitivity, an increase in resistance of the wiring due to a void generated and growing in a wiring portion held by and between upper and lower plugs.

Embodiment 8

Figure 16:
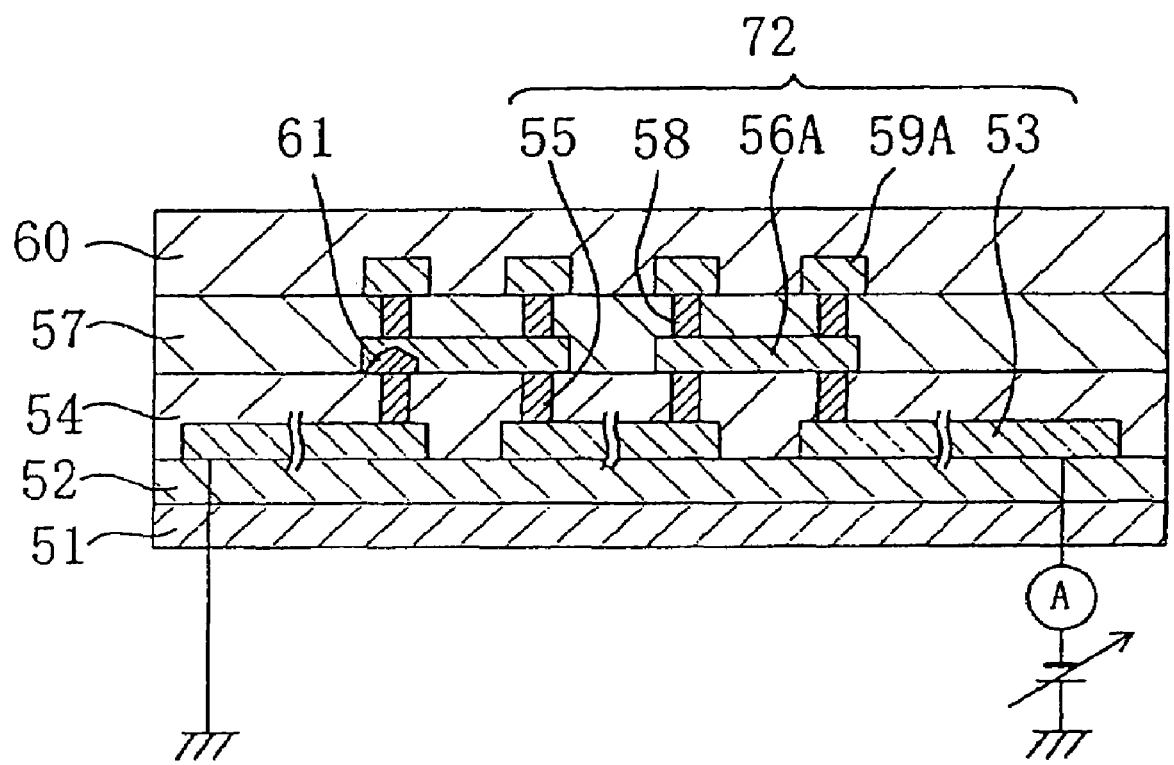
FIG. 16 is a section view of a semiconductor device according to an eighth embodiment of the present invention.

FIG. 16 is a section view of a semiconductor device according to an eighth embodiment of the present invention. In FIG. 16, like parts are designated by like reference numerals used in FIG. 14. In FIG. 16, second-layer aluminium alloy wirings 56A as wirings and third-layer aluminium alloy wirings 59A as upper-layer wirings are respectively different in sizes from the second- and third-layer aluminium alloy wirings 56, 59 in FIG. 1.

As shown in FIG. 16, the semiconductor device of the eighth embodiment is arranged such that a plurality of first-layer aluminium alloy wirings 53 and a plurality of second-layer aluminium alloy wirings 56A are insulated by a silicon oxide layer 54, and are electrically connected in series to each other through W plugs 55, and that a test pattern 72 for measuring a via resistance for reliability evaluation, is formed by these serially connected first-layer aluminium alloy wirings 53 and second-layer aluminium alloy wirings 56A, the W plugs 55, the W plugs 58 connected to the tops of the second-layer aluminium alloy wirings 56A, and the third-layer aluminium alloy wirings 59A. Even though in contact with the second-layer aluminium alloy wirings 56A, the W plugs 58 serve as false plugs in which no electric current flows when a voltage is applied to the test pattern 72. The W plugs 58 terminate at the electrically isolated third-layer aluminium alloy wirings 59A.

The resistance value of the test pattern 72 is a sum of the resistance values of the first- and second-layer aluminium alloy wirings 53, 56A and the resistance values of the W plugs 55. When it is now supposed that the sheet resistance of each of the aluminium alloy wirings 53, 56A, is equal to 100 mΩ/□, that the resistance value of each of the W plugs 55 is equal to 1Ω, and that the number of the W plugs 55 is 1,000, the resistance value of the test pattern 72 in a normal mode is equal to 1,500Ω.

According to the eighth embodiment, the second-layer aluminium alloy wirings 56A have, on the tops thereof, the electrically isolated W plugs 58 and the third-layer aluminium alloy wirings 59A, and the test pattern 72 employs a stacked via structure. Thus, the second-layer aluminium alloy wirings 56A receive stress from the upper and lower W plugs 55, 58. When a void 61 grows in a second-layer aluminium alloy wiring 56A due to a stress migration phenomenon, the test pattern 72 is accordingly increased in resistance value. Therefore, by measuring the resistance value of the test pattern 72, it is possible to detect a disconnection of an aluminium alloy wiring 56A in the vicinity of plugs. According to the eighth embodiment, the number of the W plugs in the test pattern 72 is reduced to a half as compared with the seventh embodiment. This reduces the resistance value in the test pattern 72 in a normal mode, thus further enhancing the detection sensitivity.

Embodiment 9

Figure 17:
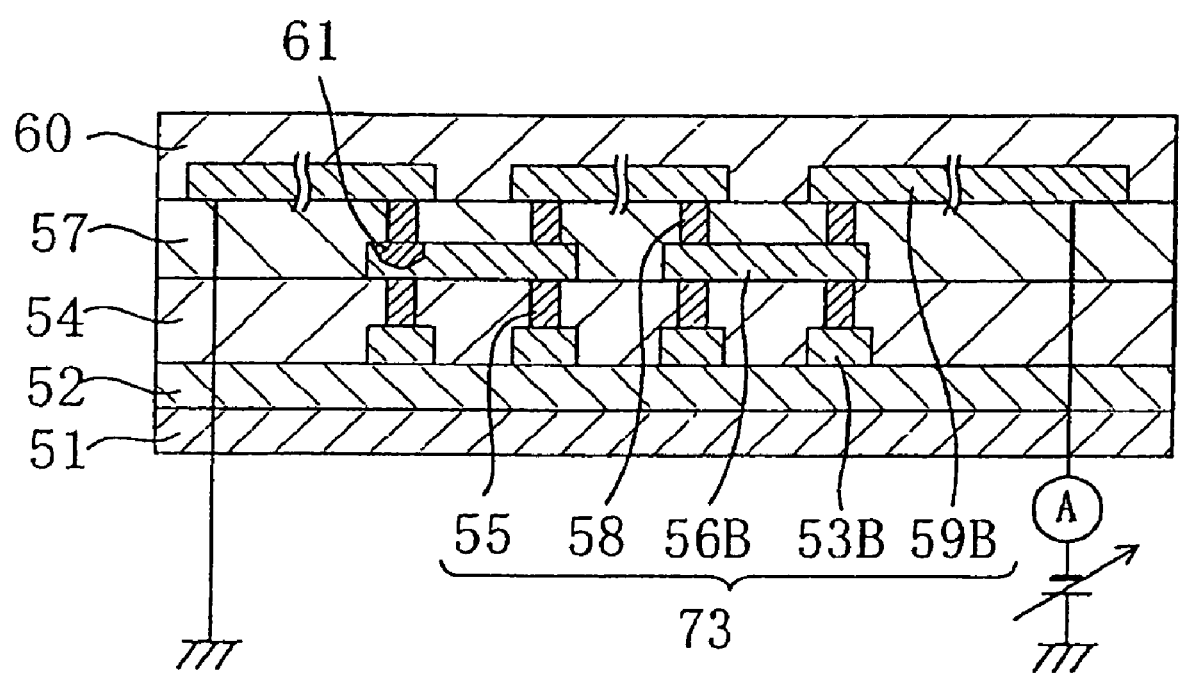
FIG. 17 is a section view of a semiconductor device according to a ninth embodiment of the present invention.

FIG. 17 is a section view of a semiconductor device according to a ninth embodiment of the present invention. In FIG. 17, like parts are designated by like reference numerals used in FIG. 14. In FIG. 17, first-layer aluminium alloy wirings 53B as lower-layer wirings, second-layer aluminium alloy wirings 56B as wirings and third-layer aluminium alloy wirings 59B as upper-layer wirings are respectively different in sizes from the first-, second- and third-layer aluminium alloy wirings 53, 56, 59 in FIG. 14.

As shown in FIG. 17, the semiconductor device of the ninth embodiment is arranged such that a plurality of second-layer aluminium alloy wirings 56B and a plurality of third-layer aluminium alloy wirings 59B are insulated from each other by a silicon oxide layer 57, and are electrically connected in series to each other through W plugs 58, and that a test pattern 73 for measuring a via resistance for reliability evaluation, is formed by these serially connected second-layer aluminium alloy wirings 56B and third-layer aluminium alloy wirings 59B, the W plugs 58, the W plugs 55 connected to the undersides of the second-layer aluminium alloy wirings 56B, and the first-layer aluminium alloy wirings 53B. Even though in contact with the second-layer aluminium alloy wirings 56B, the W plugs 55 serve as false plugs in which no electric current flows when a voltage is applied to the test pattern 73. The W plugs 55 terminate at the electrically isolated first-layer aluminium alloy wirings 53B.

The resistance value of the test pattern 73 is a sum of the resistance values of the second- and third-layer aluminium alloy wirings 56B, 59B and the resistance values of the W plugs 58. When it is now supposed that the sheet resistance of each of the aluminium alloy wirings 56B, 59B, is equal to 100 mΩ/□, that the resistance value of each of the W plugs 58 is equal to 1Ω, and that the number of the W plugs 58 is 1,000, the resistance value of the test pattern 73 in a normal mode is equal to 1,500Ω.

According to the ninth embodiment, the second-layer aluminium alloy wirings 56B have, at the undersides thereof, the electrically isolated W plugs 55 and the first-layer aluminium alloy wirings 53B, and the test pattern 73 employs a stacked via structure. Thus, the second-layer aluminium alloy wirings 56B receive stress from the upper and lower W plugs 55, 58. When a void 61 grows in a second-layer aluminium alloy wiring 56B due to a stress migration phenomenon, the test pattern 73 is accordingly increased in resistance value. Therefore, by measuring the resistance value of the test pattern 73, it is possible to detect a disconnection of the aluminium alloy wiring 56B in the vicinity of plugs. According to the ninth embodiment, the number of serially connected W plugs in the test pattern 73 is reduced to a half as compared with the seventh embodiment. This reduces the resistance value of the test pattern 73 in a normal mode, thus further enhancing the detection sensitivity.

Embodiment 10

Figure 18:
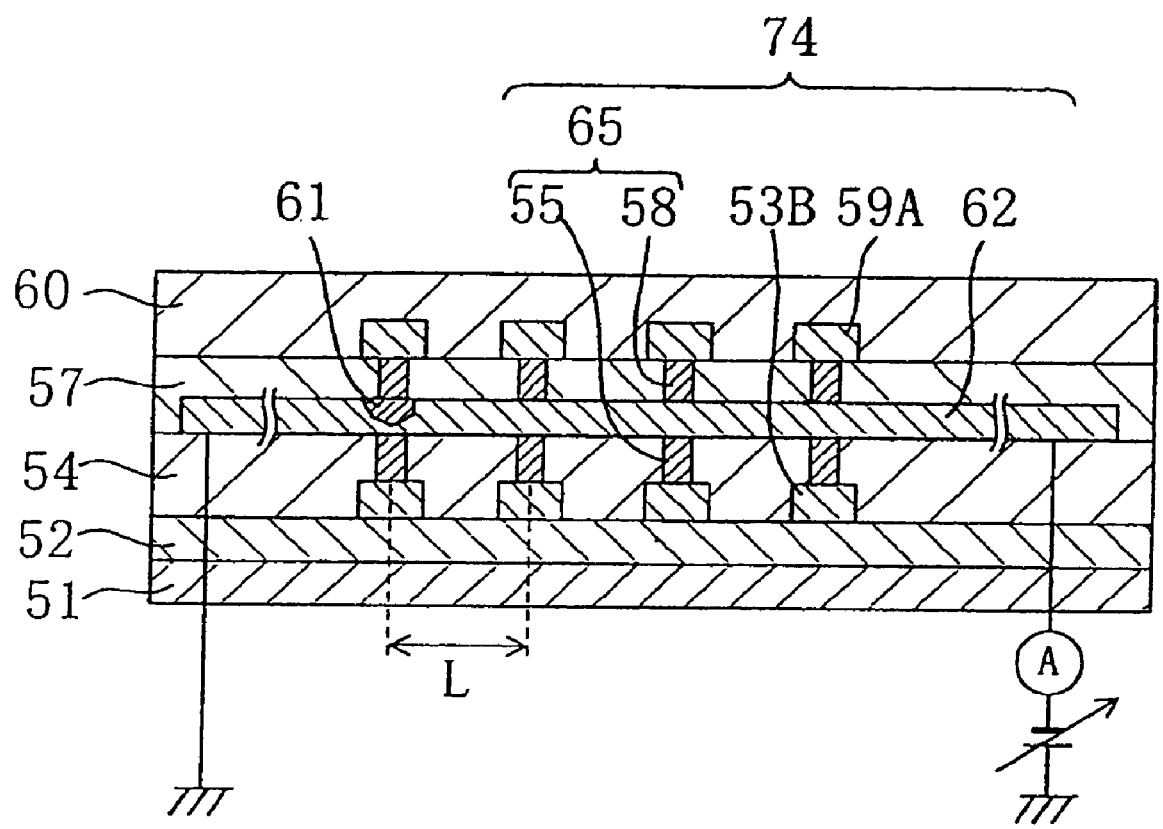
FIG. 18 is a section view of a semiconductor device according to a tenth embodiment of the present invention.

FIG. 18 is a section view of a semiconductor device according to a tenth embodiment of the present invention. In FIG. 18, like parts are designated by like reference numerals used in each of FIGS. 14, 16, 17. A second-layer aluminium alloy wiring 62 as a wiring has a width of 0.6 μm and a length of 6 mm. Even though in contact with the second-layer aluminium alloy wiring 62, W plugs 55 serve as false plugs which terminate at electrically isolated first-layer aluminium alloy wirings 53B. Even though in contact with the second-layer aluminium alloy wiring 62, W plugs 58 serve as false plugs which terminate at electrically isolated third-layer aluminium alloy wirings 59A. Pairs of false plugs 65 are formed by the W plugs 55, 58 opposite to each other with respect to the second-layer aluminium alloy wiring 62.

As shown in FIG. 18, the semiconductor device of the tenth embodiment is arranged such that the second-layer aluminium alloy wiring 62 is in contact with the pairs of false plugs 65 and that a test pattern 74 for measuring a via resistance for reliability evaluation, is formed by the second-layer aluminium alloy wiring 62, the pairs of false plugs 65, and the first- and third-layer aluminium alloy wirings 53B, 59A at which the W plugs 55, 58 forming the pairs of false plugs 65 respectively terminate.

When it is now supposed that the sheet resistance of the aluminium alloy wiring 62, is equal to 100 mΩ/□, the resistance value of the test pattern 74 in a normal mode is equal to 1,000Ω.

According to the tenth embodiment, the test pattern 74 has a stacked via structure. Thus, the second-layer aluminium alloy wiring 62 receives stress from the upper and lower W plugs 55, 58. When a void 61 grows in the second-layer aluminium alloy wiring 62 due to a stress migration phenomenon, the test pattern 74 is accordingly increased in resistance value. Therefore, by measuring the resistance value of the test pattern 74, it is possible to detect a disconnection of the aluminium alloy wiring 62 in the vicinity of plugs. According to the tenth embodiment, the test pattern 74 does not have serially connected W plugs. This reduces the resistance value of the test pattern 74, thus increasing the sensitivity of detection of an increase in resistance due to a disconnection phenomenon.

Figure 19:
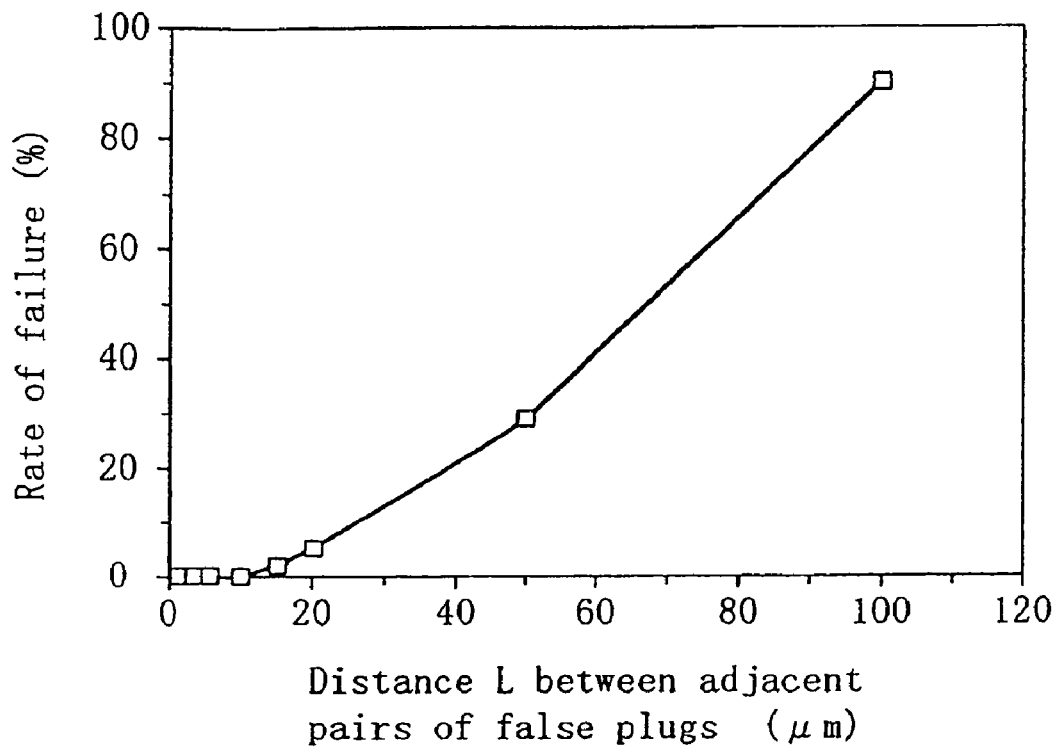
FIG. 19 is a graph illustrating the dependency of stress migration failure upon the distance between adjacent pairs of false plugs in the semiconductor device according to the tenth embodiment of the present invention.

FIG. 19 is a graph illustrating the dependency of stress migration failure upon the distance between adjacent pairs of false plugs in semiconductor devices according to the embodiment shown in FIG. 18. Likewise in the seventh embodiment, the semiconductor devices each having the arrangement in FIG. 18 were stored at 250° C. for 1,000 hours and the rates of increase in resistance value of the test patterns 74 were measured. Then, the rate of failure was obtained on the basis that semiconductor devices of which increase rate were not less than 20%, were judged as failure. As a parameter, the distance L between adjacent pairs of false plugs 65 was changed from 1 μm to 100 μm. In FIG. 19, ordinate axis represents rate of failure (%) after storage for 1,000 hours while abscissa axis represents the distance L (μm) between adjacent pairs of false plugs 65. Each wiring has a thickness of 0.6 μm.

As shown in FIG. 19, when the distance L between adjacent pairs of false plugs 65 was not less than 10 μm, a failure occurred in semiconductor devices. A void generated in a wiring grows when crystal defects in the wiring are collected. When the wiring volume is small, no void is increased in size of not less than 0.5 μm which will result in a failure, even though all crystal defects in the wiring are collected. As understood from FIG. 19, when the distance L between adjacent pairs of false plugs 65 is not less than 10 μm, it is possible to detect, with high sensitivity, an increase in resistance of a wiring due to the void generated and growing in its portion held by and between a pair of false plugs 65.

Modification of Embodiment 10

Figure 20:
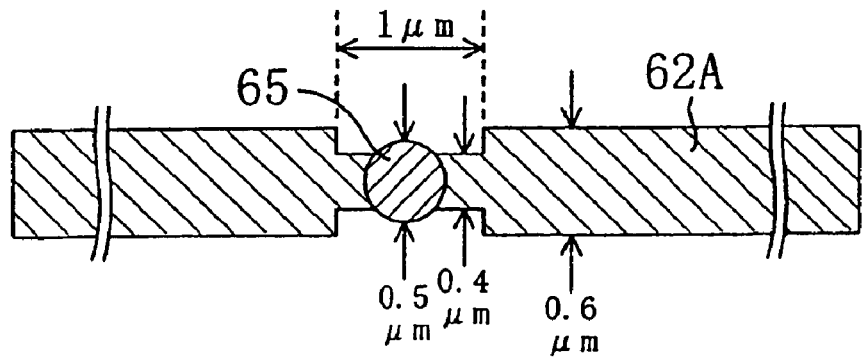
FIG. 20 is a plan view of a modification of the semiconductor device according to the tenth embodiment of the present invention.

FIG. 20 is a plan view of a modification of the semiconductor device according to the tenth embodiment of the present invention, illustrating that portion of a second-layer aluminium alloy wiring which is in contact with a pair of false plugs. In FIG. 20, a second-layer aluminium alloy wiring 62A is in contact at its top and underside with a pair of false plugs 65, respectively. In the second-layer aluminium alloy wiring 62A, its portion in contact with the pair of false plugs 65 has a length of 1 μm and a wiring width of 0.4 μm, and other portion has a wiring width of 0.6 μm. The second-layer aluminium alloy wiring 62A has a length of 6 mm. Each of the pair of false plugs 65 has a diameter of 0.5 μm.

When it is now supposed that the sheet resistance of the aluminium alloy wiring 62A, is equal to 100 mΩ/□ and that the number of the pairs of false plugs 65 is 1,000 pairs, the resistance value of the test pattern 74 is equal to 1,008Ω. According to this modification, the test pattern 74 has a stacked via structure. Thus, the second-layer aluminium alloy wiring 62A receives stress from the upper and lower W plugs 55, 58. When a void grows in the second-layer aluminium alloy wiring 62A due to a stress migration phenomenon, the test pattern 74 is accordingly increased in resistance value. Therefore, by measuring the resistance value of the test pattern 74, it is possible to detect a disconnection of the aluminium alloy wiring 62A in the vicinity of plugs.

In the structure of this modification, the wiring width of those top and underside portions of the second-layer aluminium alloy wiring 62A which are in contact with a pair of false plugs 65, is smaller than the plug diameter. This securely increases the resistance value of a wiring when the wiring is disconnected due to stress. This enhances the sensitivity of detection of an increase in resistance due to a disconnection phenomenon.

In each of the seventh to tenth embodiments, the description has been made of a semiconductor device having three wiring layers. However, the present invention may be arranged such that a semiconductor device has four or more wiring layers. When four or more wiring layers are disposed, the wiring layer between upper and lower plugs opposite to each other, may be disposed at other wiring layer than the highest and lowest wiring layers.

What is claimed is:

1. A wiring structure of a semiconductor device comprising:
    a wiring layer having an upper surface and a lower surface;
    an upper plug formed in a first insulating layer above the upper surface of the wiring layer;
    a lower plug formed in a second insulating layer below the lower surface of the wiring layer and opposite to the upper plug with the wiring layer interposed; and
    at least one cap layer interposed between the wiring layer and any one of the upper plug and the lower plug and positioned below any one of a plane defined by a substantial portion of the upper surface and a plane defined by a substantial portion of the lower surface, respectively,
    wherein, in a case where there is a single grain in a first region of the wiring layer between the upper plug and the lower plug, a size of the single grain in the first region is substantially equal to an average size of grains in a second region of the wiring layer not between the upper plug and the lower plug, and in a case where there are a plurality of grains in the first region, an average size of the plurality of grains in the first region is substantially equal to an average size of the grains in the second region.

2. The wiring structure according to claim 1, wherein the wiring layer has a substantially continuous distribution of grains from the first region to the second region.

3. The wiring structure according to claim 2, wherein no void is formed between the first region and the second region.

4. The wiring structure according to claim 1, wherein a surface orientation of the single grain or plurality of grains in the first region of the wiring layer is substantially equal to a surface orientation of the grains in the second region of the wiring layer.

5. The wiring structure according to claim 4, wherein no void is formed between the first region and the second region.

6. The wiring structure according to claim 5, wherein a continuous surface orientation exists from the first region to the second region.

7. The wiring structure according to claim 1, wherein a distance between a center of a contact surface between the upper plug and the wiring layer and a center of a contact surface between the lower plug and the wiring layer is about ⅔ or more of the diameter of each of the upper plug and the lower plug.

8. The wiring structure according to claim 1, wherein a distance between an upper surface of the lower plug and the plane defined by the substantial portion of the lower surface is 0.2 µm or less.

9. The wiring structure according to claim 1, wherein a distance between an upper surface of the lower plug and the plane defined by the substantial portion of the lower surface is about ⅓ or less of the diameter of each of upper plug and lower plug.

10. The wiring structure according to claim 1, wherein the wiring layer, the upper plug and the lower plug are made of the same material.

11. The wiring structure according to claim 1, wherein a thermal expansion coefficient of a material of the wiring layer and a thermal expansion coefficient of at least one of the upper plug and the lower plug are substantially equal.

12. The wiring structure according to claim 1, wherein the at least one cap layer has a thickness excluding a thickness in the range from 10 nm to 80 nm.

13. The wiring structure according to claim 1, wherein the at least one cap layer has a thickness of 10 nm or less.

14. The wiring structure according to claim 1, wherein the at least one cap layer has a thickness of 80 nm or more.

15. The wiring structure according to claim 1, wherein the at least one cap layer is formed of a first cap layer formed on the wiring layer upper surface below the upper plug and a second cap layer different from the first cap layer formed on the wiring layer upper surface below the first insulating layer.

16. The wiring structure according to claim 1, wherein the at least one cap layer is formed of a first cap layer formed continuously on the wiring layer upper surface below the upper plug and the first insulating layer and a second cap layer different from the first cap layer formed on the first cap layer below the upper plug.

17. The wiring structure according to claim 1, wherein the at least one cap layer is a continuous layer formed on the wiring layer upper surface below the upper plug and below the first insulating layer.

18. The wiring structure according to claim 1, wherein the at least one cap layer comprises:
   a first cap layer interposed between the wiring layer and the upper plug and positioned below the plane defined by the substantial portion of the upper surface; and
   a second cap layer interposed between the wiring layer and the lower plug and positioned below the plane defined by the substantial portion of the lower surface.

19. The wiring structure according to claim 18, wherein no void is formed between the first region and the second region.

20. The wiring structure according to claim 18, wherein a surface orientation of the simile grain or plurality of grains in the first region of the wiring layer is substantially equal to a surface orientation of the grains in the second region of the wiring layer.

21. The wiring structure according to claim 20, wherein no void is formed between the first region and the second region.

22. The wiring structure according to claim 20, wherein a continuous surface orientation exists from the first region to the second region.

23. The wiring structure according to claim 18, wherein the distance between a center of a contact surface between the upper plug and the wiring layer and a center of a contact surface between the lower plug and the wiring layer is about ⅔ or more of the diameter of each of the upper plug and the lower plug.

24. The wiring structure according to claim 18, wherein the distance between an upper surface of the lower plug and the plane defined by the substantial portion of the lower surface is 0.2 µm or less.

25. The wiring structure according to claim 18, wherein a distance between an upper surface of the lower plug and the plane defined by the substantial portion of the lower surface is about ⅓ or less of the diameter of each of upper plug and lower plug.

26. The wiring structure according to claim 18, wherein the wiring layer, the upper plug and the lower plug are made of the same material.

27. The wiring structure according to claim 18, wherein a thermal expansion coefficient of a material of the wiring layer and a thermal expansion coefficient of at least one of the upper plug and the lower plug are substantially equal.

28. The wiring structure according to claim 18, wherein the second cap layer has a thickness excluding a thickness in the range from 10 nm to 80 nm.

29. The wiring structure according to claim 18, wherein the second cap layer has a thickness of 10 nm or less.

30. The wiring structure according to claim 18, wherein the second cap layer has a thickness of 80 nm or mare.

31. The wiring structure according to claim 18, wherein the second cap layer is a continuous layer formed below the lower surface of the wiring layer and above the lower plug and the second insulating layer.

32. The wiring structure according to claim 18, wherein the wiring layer has a substantially continuous distribution of grains from the first region to the second region.

33. The wiring structure according to claim 1, wherein the second region of the wiring layer is between the first insulating layer and the second insulating layer.

34. The wiring structure according to claim 1, wherein the second region of the wiring layer is between a different upper plug from said upper plug and a different lower plug from said lower plug.

* * * * *

UNITED STATES PATENT AND TRADEMARK OFFICE
CERTIFICATE OF CORRECTION

| | | |
|---|---|---|
| PATENT NO. | : 7,642,654 B2 | |
| APPLICATION NO. | : 12/236914 | |
| DATED | : January 5, 2010 | |
| INVENTOR(S) | : Shinichi Domae et al. | |

It is certified that error appears in the above-identified patent and that said Letters Patent is hereby corrected as shown below:

On the title page of the patent, in "Item (54) Title", please change

"MULTILAYER WIRING STRUCTURE OF SEMICONDUCTOR DEVICE, METHOD OF PRODUCING SAID MULTILAYER WIRING STRUCTURE AND SEMICONDUCTOR TO BE USED FOR RELIABILITY EVALUATION"

to

--MULTILAYER WIRING STRUCTURE OF SEMICONDUCTOR DEVICE, METHOD OF PRODUCING SAID MULTILAYER WIRING STRUCTURE AND SEMICONDUCTOR DEVICE TO BE USED FOR RELIABILITY EVALUATION--.

Signed and Sealed this

Eighth Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,642,654 B2
APPLICATION NO. : 12/236914
DATED : January 5, 2010
INVENTOR(S) : Shinichi Domae et al.

It is certified that error appears in the above-identified patent and that said Letters Patent is hereby corrected as shown below:

On the title page of the patent, in "Item (54) and at Column 1, lines 1-5, Title", please change "MULTILAYER WIRING STRUCTURE OF SEMICONDUCTOR DEVICE, METHOD OF PRODUCING SAID MULTILAYER WIRING STRUCTURE AND SEMICONDUCTOR TO BE USED FOR RELIABILITY EVALUATION"

to

--MULTILAYER WIRING STRUCTURE OF SEMICONDUCTOR DEVICE, METHOD OF PRODUCING SAID MULTILAYER WIRING STRUCTURE AND SEMICONDUCTOR DEVICE TO BE USED FOR RELIABILITY EVALUATION--.

This certificate supersedes the Certificate of Correction issued June 8, 2010.

Signed and Sealed this

Twenty-ninth Day of June, 2010

David J. Kappos
*Director of the United States Patent and Trademark Office*